(12) United States Patent
Kaptanoglu et al.

(10) Patent No.: US 7,924,053 B1
(45) Date of Patent: Apr. 12, 2011

(54) CLUSTERED FIELD PROGRAMMABLE GATE ARRAY ARCHITECTURE

(75) Inventors: Sinan Kaptanoglu, Belmont, CA (US); Wenyi Feng, Sunnyvale, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 12/362,844

(22) Filed: Jan. 30, 2009

Related U.S. Application Data

(60) Provisional application No. 61/024,867, filed on Jan. 30, 2008.

(51) Int. Cl.
*H01L 25/00* (2006.01)
(52) U.S. Cl. .......................................... 326/41; 326/47
(58) Field of Classification Search ................ 716/8, 16; 326/37–41, 47
See application file for complete search history.

(56) References Cited

U.S. PATENT DOCUMENTS

| | | | |
|---|---|---|---|
| 5,157,654 A | 10/1992 | Cisneros | |
| 5,940,389 A | 8/1999 | Yang et al. | |
| 6,292,019 B1 * | 9/2001 | New et al. ........................ | 326/41 |
| 6,294,928 B1 | 9/2001 | Lytle et al. | |
| 6,335,930 B1 | 1/2002 | Lee | |
| 6,341,313 B1 | 1/2002 | Kanoh | |
| 6,594,261 B1 | 7/2003 | Boura et al. | |
| 6,636,932 B1 | 10/2003 | Regev et al. | |
| 6,868,084 B2 | 3/2005 | Konda | |
| 6,975,139 B2 | 12/2005 | Pani et al. | |
| 7,020,135 B2 | 3/2006 | Klausmeier et al. | |
| 7,023,841 B2 | 4/2006 | Dell et al. | |
| 7,129,748 B1 | 10/2006 | McCollum et al. | |
| 7,224,184 B1 | 5/2007 | Levi et al. | |
| 7,319,695 B1 | 1/2008 | Agarwal et al. | |
| 7,321,237 B2 | 1/2008 | McCollum et al. | |
| 7,397,796 B1 | 7/2008 | Smiljanic | |
| 7,408,383 B1 * | 8/2008 | Feng et al. ........................ | 326/41 |
| 7,425,841 B2 * | 9/2008 | Schmit et al. ................... | 326/38 |
| 7,426,185 B1 | 9/2008 | Musacchio et al. | |
| 7,443,198 B1 | 10/2008 | McCollum et al. | |
| 7,480,246 B2 | 1/2009 | Agarwal et al. | |

(Continued)

OTHER PUBLICATIONS

Feng, W. and Kaptanoglu, S., "Designing efficient input interconnect block for LUT clusters using counting and entropy," FPA, 2007.

(Continued)

*Primary Examiner* — Vibol Tan
*Assistant Examiner* — Dylan White
(74) *Attorney, Agent, or Firm* — Lewis and Roca LLP

(57) ABSTRACT

A logic cluster for a field programmable gate array integrated circuit device is disclosed. The cluster comprises a plurality of functional blocks and three levels of routing multiplexers. External signals enter the logic cluster primarily at the third level multiplexers with a few signals entering at the second level. Combinational outputs are fed back into the first and second level multiplexers while sequential outputs are fed back into the third level multiplexers. The logic function generators have permutable inputs with varying propagation delays. Routing signals between the first and second level multiplexers are grouped into speed classes and coupled to first level multiplexers associated with different logic function generators according to their speed class. Second and third level multiplexers are organized into groups such that routing signals between the second and third level multiplexers can be localized within the area occupied by the group. Groups are pitch matched to logic function generators to optimize and modularize area. Provision is made for global and local control of the sequential elements.

14 Claims, 12 Drawing Sheets

U.S. PATENT DOCUMENTS

Figure 1:
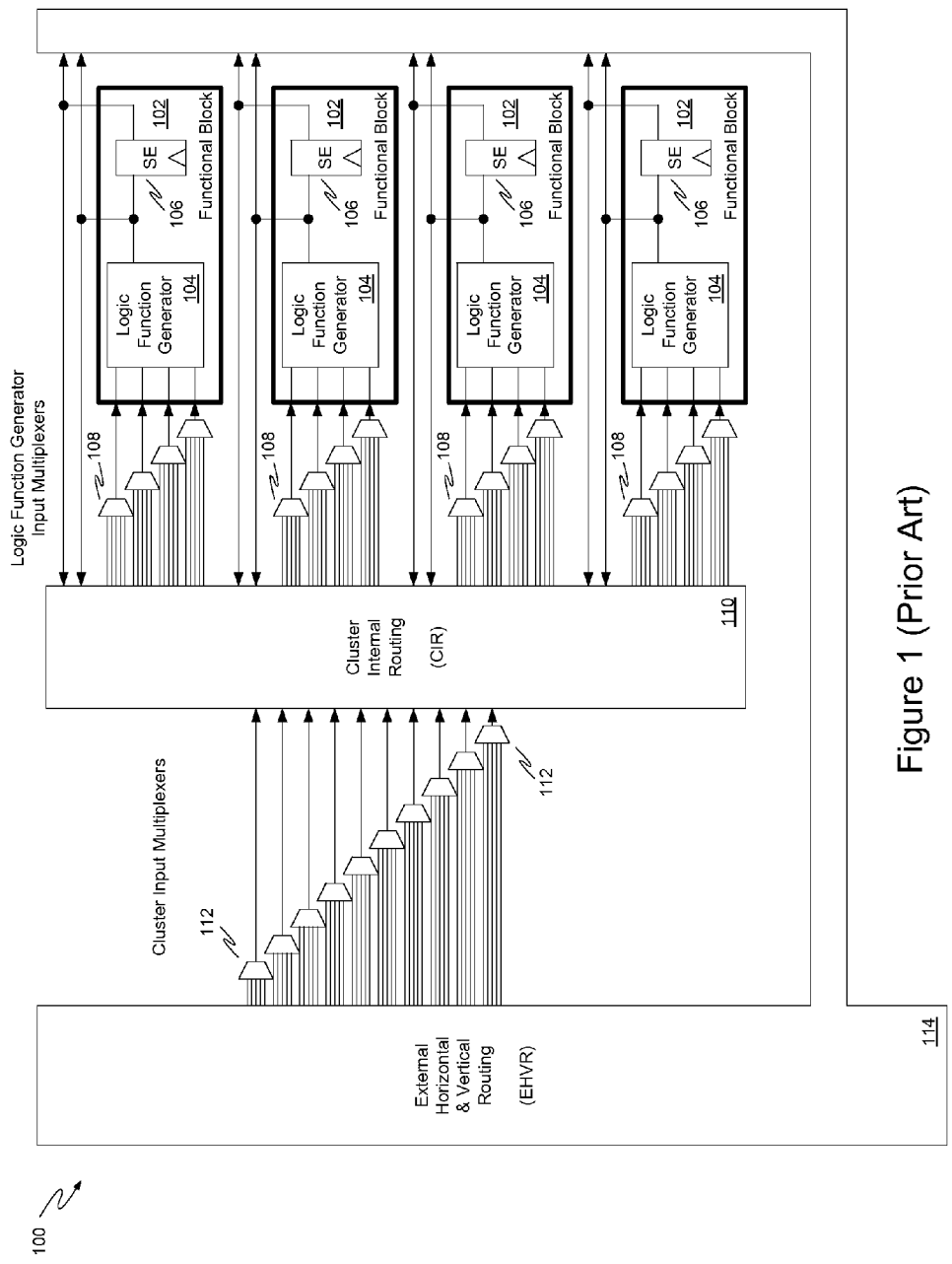

| | | | |
|---|---|---|---|
| 7,490,189 B2 | 2/2009 | Eberle et al. | |
| 7,492,182 B2 | 2/2009 | McCollum et al. | |
| 7,495,473 B2 | 2/2009 | McCollum et al. | |
| 7,538,576 B2 | 5/2009 | McCollum et al. | |
| 7,542,464 B2 | 6/2009 | Fraser | |
| 7,545,169 B1 * | 6/2009 | Feng et al. | 326/41 |
| 7,586,909 B1 | 9/2009 | Walrand et al. | |
| 7,587,697 B1 * | 9/2009 | Schmit et al. | 716/16 |
| 7,653,891 B1 * | 1/2010 | Anderson et al. | 716/16 |
| 7,816,946 B1 * | 10/2010 | Hecht et al. | 326/40 |
| 2004/0095927 A1 | 5/2004 | Chang et al. | |
| 2005/0117575 A1 | 6/2005 | Konda | |
| 2006/0164120 A1 * | 7/2006 | Verma et al. | 326/41 |
| 2006/0186920 A1 * | 8/2006 | Feng et al. | 326/41 |
| 2007/0085564 A1 * | 4/2007 | Verma et al. | 326/41 |

OTHER PUBLICATIONS

Lemieux, Guy et al, "Design of Interconnection Networks for Programmable Logic," Book: Table of Contents, List of Figures, List of Tables, List of Symbols, Chapter 2 "Interconnection Networks," copyright 2004.

Yang, Y. et al., "On Blocking Probability of Multicast Networks," IEEE Transactions of Communications, Jul. 1998, vol. 46, No. 7, pp. 957-968.

Copending U.S. Appl. No. 12/361,835 entitled "Field Programmable Gate Array Architecture Having CLOS Network-Based Input Interconnect," filed Jan. 29, 2009.

Office Action mailed Mar. 8, 2010 in copending U.S. Appl. No. 12/361,835 entitled "Field Programmable Gate Array Architecture Having CLOS Network-Based Input Interconnect," filed Jan. 29, 2009.

Final Office Action mailed Nov. 26, 2010 in copending U.S. Appl. No. 12/361,835 entitled "Field Programmable Gate Array Architecture Having CLOS Network-Based Input Interconnect," filed Jan. 29, 2009.

* cited by examiner

US 7,924,053 B1

CLUSTERED FIELD PROGRAMMABLE GATE ARRAY ARCHITECTURE

REFERENCE TO RELATED APPLICATIONS

This application claims an invention that was disclosed in Provisional Application No. 61/024,867 filed Jan. 30, 2008, entitled "Clustered Field Programmable Gate Array Architecture." The benefit under 35 USC §119(e) of the United States provisional application is hereby claimed, and the aforementioned provisional application is hereby incorporated herein by reference.

BACKGROUND OF THE INVENTION

1. Field of the Invention

The invention pertains to the field of integrated circuits. More particularly, the invention pertains to field programmable gate array integrated circuit devices.

2. The Prior Art

Field Programmable Gate Array (FPGA) integrated circuit devices are known in the art. An FPGA comprises any number of initially uncommitted functional blocks arranged in an array along with an appropriate amount of initially uncommitted routing resources. Functional blocks are circuits which can be configured to perform a variety of logic functions like, for example, AND-gates, OR-gates, NAND-gates, NOR-gates, XOR-gates, XNOR-gates, inverters, multiplexers, adders, latches, and flip/flops. Routing resources can include a mix of components such as wires, switches, multiplexers, and buffers. Logic modules, routing resources, and other features like, for example, I/O buffers and memory blocks, are the programmable elements of the FPGA.

The programmable elements have associated control elements (sometimes known as programming bits or configuration bits) which determine their functionality. The control elements may be thought of as binary bits having values such as on/off, conductive/non-conductive, true/false, or logic-1/logic-0 depending on the context. The control elements vary according to the technology employed and their mode of data storage may be either volatile or non-volatile. Volatile control elements, such as SRAM bits, lose their programming data when the PLD power supply is disconnected, disabled or turned off. Non-volatile control elements, such as antifuses and floating gate transistors, do not lose their programming data when the PLD power supply is removed. Some control elements, such as antifuses, can be programmed only one time and cannot be erased. Other control elements, such as SRAM bits and floating gate transistors, can have their programming data erased and may be reprogrammed many times. The detailed circuit implementation of the functional blocks and routing resources can vary greatly and is appropriate for the type of control element used.

Typically a user creates a logic design inside manufacturer-supplied design software. The design software then takes the completed design and converts it into the appropriate mix of configured logic modules and other programmable elements, maps them into physical locations inside the FPGA, configures the interconnect to route the signals from one logic module to another, and generates the data structure necessary to assign values to the various control elements inside the FPGA.

Many FPGA architectures employing various different functional blocks and interconnect arrangements are known in the art. Some architectures are flat while others are clustered. In a flat architecture, the logic modules may or may not be grouped together with other logic modules, but all of the logic modules have similar or nearly equivalent access to the larger routing architecture. In a clustered architecture, the logic modules are grouped together into clusters, meaning that all of the logic modules in the cluster have some degree of exclusive routing interrelationship between themselves relative to logic modules in other clusters.

FIG. 1 illustrates a block diagram of a prior art logic cluster 100 which illustrates some basic principles of a clustered architecture. The illustrative logic cluster contains four functional blocks 102, though any number can be present. Typically a functional block 102 comprises a logic function generator circuit (or LFG) 104 and an associated sequential element 106 (designated SE in the diagram) which is typically a flip/flop that can also be configured to be a latch. The ones in the diagram have four logic input interconnects since in practice a look-up table (LUT) with four inputs (LUT4) is the most common function generator in this sort of architecture. The output of each LFG is coupled to the data input of the associated sequential element. The output of each logic function generator and each sequential element is coupled to a functional block output. The output coupled to the function generator is a combinational output while the output coupled to the sequential element is a sequential output.

Functional block 102 is a very simple exemplary functional block. Many others are known in the art. Typically there are additional routing multiplexers present in the functional block 102 to allow one of the LFG 104 inputs to bypass the LFG 104 and enter the data input of the sequential element 104. Sometimes there is a fifth input that can bypass LFG 104 without stealing one of its inputs. Often the output of the sequential element 106 can be fed back into one of the LFG 104 inputs through another routing multiplexer. Support circuits for other functions like binary arithmetic or cascading LFGs into wide functions are present. While the place and route tools in the design software will utilize these features when available, these are generally special cases separate from the general cluster routing functionality.

Typically the sequential element is more complicated than the simple D-flip/flop shown in FIG. 1. Often there will be, for example, a set signal, a reset signal, an enable signal, a load signal, and a clock signal (shown but without its source) or some combination thereof present. Collectively these signals are called sequential control inputs or global inputs (since they are often driven by signals distributed globally around the FPGA) and they typically have their own associated routing resources that may or may not be coupled to the cluster routing resources shown in FIG. 1.

The box designated Cluster Internal Routing (CIR) 110 contains the cluster internal interconnects and the box designated External Horizontal & Vertical Routing (EHVR) 114 contains the external interconnects and other routing resources of the larger FPGA (not shown). Thus in FIG. 1, CIR 100 contains only routing wires, while EHVR 114 contains a variety of different elements like switches, multiplexers, and buffers in addition to routing wires. Functional block output interconnects are cluster output interconnects if they connect to EHVR 114. If a functional block output interconnect connects to the CIR 110, it is called a feedback interconnect since it allows cluster outputs to feed back to inputs of LFGs in the same cluster without leaving and reentering the cluster by means of cluster outputs and external interconnect and routing resources. A functional block output interconnect can be both a cluster output interconnect and a feedback interconnect if it connects to both the CIR 110 and EHVR 114.

In FIG. 1, the Logic Function Generator Input Multiplexers (some exemplary instances being labeled 108) are coupled between the Cluster Internal Routing 110 and the various logic inputs coupled to the functional blocks 102. Since there are four functional blocks each with four input interconnects, there are a total of sixteen Logic Function Generator Input Multiplexers in the exemplary cluster 100. Typically, the number of data channels (or data inputs) on each Logic Function Generator Input Multiplexer is less than the total number of lines in CIR 110, so each Logic Function Generator Input Multiplexer can only route a subset of the signals inside CIR 110 to its associated LFG input.

In the architecture 100 of FIG. 1, signals are transmitted from the EHVR 114 to the CIR 110 by ten Cluster Input Multiplexers, two exemplary ones being labeled 112. Various interconnects and resources from other parts of the FPGA are connected to the inputs of the Cluster Input Multiplexers by means of the External Horizontal & Vertical Routing 114. The lines internal to the Cluster Internal Routing box 110 come from a variety of sources: the outputs of the Cluster Input Multiplexers, the outputs of the cluster's LFGs and SEs, and possibly other sources such as clock networks and other special functions not shown in FIG. 1 to avoid overcomplicating the diagram.

As FPGAs get larger, clustered architectures get favored over completely flat ones, based on the ease of place and route, and how fast this task can be accomplished by the design software. There are many examples of clustered architectures in both the academic literature as well as in commercial products.

Figure 2A:
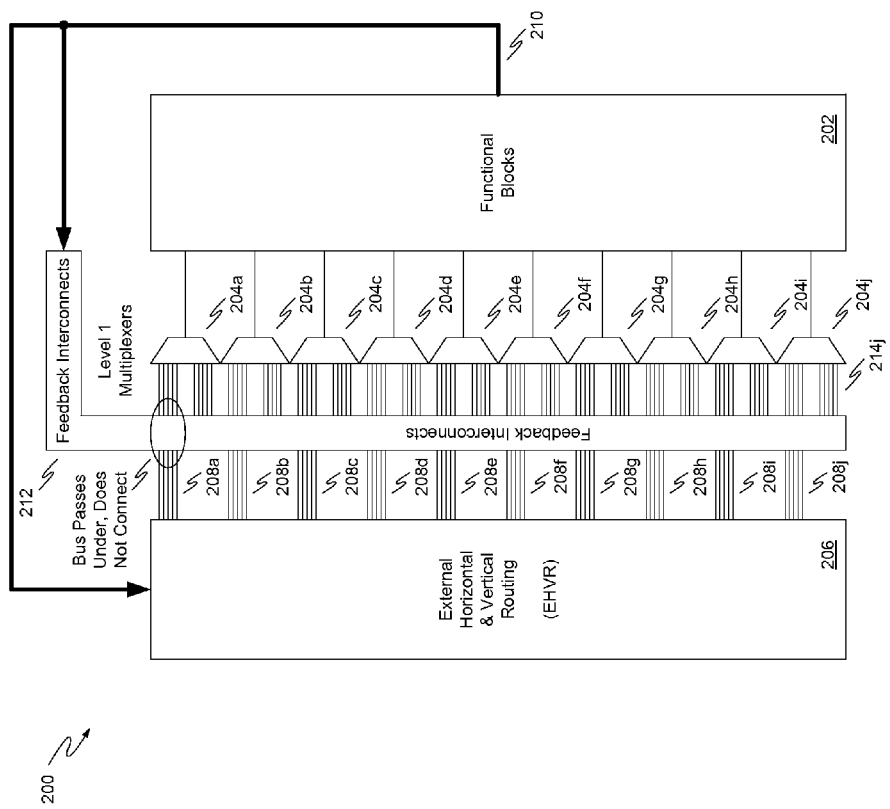

FIG. 2A shows an exemplary cluster 200 of a type known in the art. Present in FIG. 2A are functional blocks 202, Level 1 multiplexers 204*a* through 204*j*, EHVR 206, cluster input interconnect busses 208*a* through 208*j*, functional block output bus 210, and feedback interconnects 212. There can be any number of functional blocks of various types inside of box 202 as a matter of design choice. This is an abstraction intended to focus attention on the relationships between classes of interconnects inside cluster 200 rather than on the detailed connections of a specific circuit topology.

The inputs of the functional blocks 202 are coupled to the outputs of the first level (or level 1) multiplexers 204*a* through 204*j*. While ten level 1 multiplexers 204*a* through 204*j* are shown in FIG. 2A, the exact number present is equal to the total of all of the inputs of all of the functional blocks 202. The number of input channels of the multiplexers 204*a* through 204*h* need not be equal. Similarly, the portion of the input channels into each multiplexer from each of the sources shown need not be equal.

The external horizontal and vertical routing (EHVR) 206 contains routing interconnects and other routing resources such as, for example, multiplexers, buffers, and control elements for programming and enabling them. Placing the balance of the FPGA routing in box 206 is a deliberate abstraction to allow focusing on the relationships of classes of interconnects inside cluster 200.

The level 1 multiplexers 204*a* through 204*j* are coupled to EHVR 206 by cluster input interconnect busses 208*a* through 208*j*. While each cluster input interconnect bus 208*a* through 208*j* is shown with exactly five lines in FIG. 2A, this is an abstraction and any number of interconnects may be present as a matter of design choice.

The outputs of functional blocks 202 form functional block output bus 210, which is shown coupling functional blocks 202 to EHVR 206 and feedback interconnects 212. The portion of the interconnects in functional block output bus 210 that couple to either EHVR 206 or feedback interconnects 212 is a matter of design choice.

Feedback interconnects 212 are coupled to inputs on level 1 multiplexers 204*a* through 204*j* by interconnect busses 214*a* through 214*j* (though only 214*j* is labeled in FIG. 2A to avoid cluttering and obscuring the drawing figure). The feedback interconnects are functional block outputs that can be routed back to the functional block inputs without exiting and reentering cluster 200 through EHVR 206, giving the feedback interconnects a significantly faster return path. Level 1 multiplexer 204*a* is coupled to interconnect bus 214*a*, level 1 multiplexer 204*b* is coupled to interconnect bus 214*b*, and so on through Level 1 multiplexer 204*j* and interconnect bus 214*j*. Although five wires are shown in each of interconnect busses 214*a* through 214*j* the exact number of wires present can vary from one bus to another and is a matter of design choice.

While interconnect busses 208*a* through 208*j* couple EHVR 206 to the level 1 multiplexers 204*a* through 204*j*, they do not connect to the feedback interconnects 212. In FIG. 2A, they can be thought of as "passing under" them instead. One example is indicated by an oval designated "Bus Passes Under, Does Not Connect." This convention will be used with respect to various interconnect representations throughout this application, since drawing such busses in the more conventional "passing over" style makes the drawing figures harder to read and obscures the concepts being illustrated.

In FIG. 2A, EHVR 206 contains the external interconnects and other routing resources of the larger FPGA (not shown) while feedback interconnects 212 contains only routing wires.

Cluster 200 can be described as an I1F1 type cluster. The "I1" signifies that inputs to the cluster enter the cluster internal routing resources at the first level of multiplexers while the "F1" signifies that the feedback interconnects also enter the cluster internal routing resources at the level 1 multiplexers. This type of shorthand description is useful for characterizing many types of clustered architectures. Examples of I1F1 clusters are found in a number of different commercial FPGA families offered by Xilinx, Inc., of San Jose, Calif.

Figure 2B:
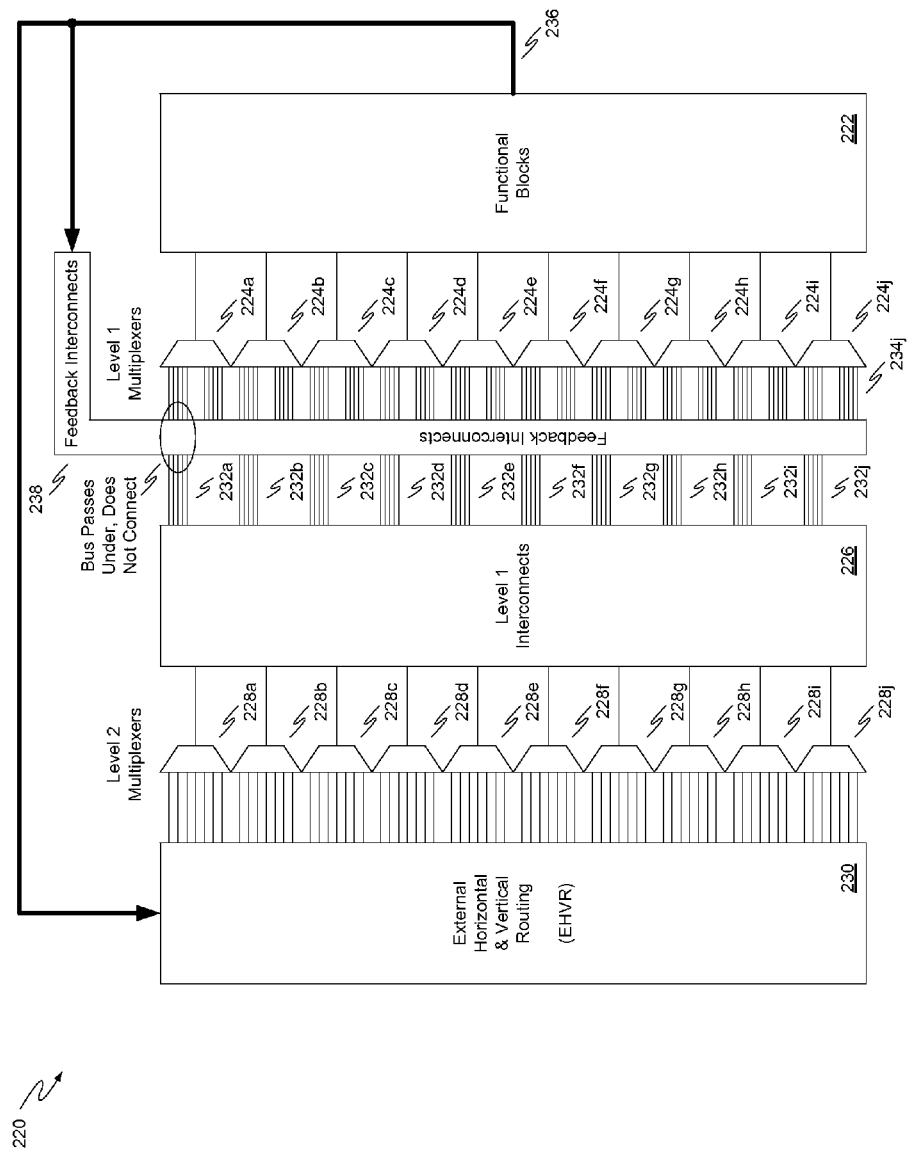

An I2F1 cluster 220 of the prior art is shown in FIG. 2B. Present in the drawing figure are functional blocks 222, level 1 multiplexers 224*a* through 224*j*, local interconnects 226, level 2 multiplexers 228*a* through 228*j*, EHVR 230, interconnect busses 232*a* through 232*j*, interconnect busses 234*a* through 234*j* (though only 234*j* is labeled in the figure), functional block output bus 236, and feedback interconnects 238.

Any number of functional blocks may be present inside box 222 as a matter of design choice. Although ten level 1 multiplexers are shown, the number of level 1 multiplexers is equal to the total number of functional block inputs and the number of data channels on the various level 1 multiplexers can vary from one to another as a matter of design choice. While each level 1 multiplexer is shown coupled to two busses of five interconnects each, the number of interconnects in each bus can vary as a matter of design choice. Similarly, while ten level 2 multiplexers 228*a* through 228*j* are shown, the exact number will vary from architecture to architecture as a matter of design choice.

The data flow for external signals is interconnects originating in EHVR 230 are coupled to the inputs of the second level multiplexers 228*a* through 228*j*. While seven interconnects are shown for each level 2 multiplexer in the drawing figure, the exact number can vary from multiplexer to multiplexer as a matter of design choice. The outputs of the level 2 multiplexers are coupled to the level 1 interconnections 226, which in turn are coupled to some of the data channels on the level 1 multiplexers, which in turn have their outputs coupled to the inputs of the functional blocks 222. Thus the cluster inputs enter the internal cluster routing resources (meaning multiplexers and interconnects) at the level 2 multiplexers (I2 in I2F1). The box labeled level 1 interconnects 226 in FIG. 2B contains only routing wires and all of the routing decisions are implemented by control elements (not shown) governing the level 1 multiplexers 224a through 224j and level 2 multiplexers 228a through 228j.

The data flow for feedback signals starts from the outputs of the functional blocks 222 that form functional block output bus 236. Some of the interconnects in bus 236 are coupled to the feedback interconnects 238 which in turn are coupled to some of the data channels on the level 1 multiplexers. Thus the feedback interconnects enter the internal cluster routing resources at the level 1 multiplexers (the F1 in I2F1). The box labeled feedback interconnects 238 in the drawing figure contain only routing wires and routing decisions internal to cluster 220 with respect to these wires are made by the control elements governing the level 1 multiplexers 224a through 224j. Interconnects in functional block output bus 336 can be coupled to feedback interconnects 238, EHVR 230, or both. The number and destinations of the interconnects in functional block output bus 236 is a matter of design choice.

I2F1 clusters are well known in both academia and in commercial FPGAs. Such a cluster is described in the textbook Guy Lemieux and David Lewis, *Design of Interconnection Networks for Programmable Logic*, Kluwer Academic Publishers, 2004 (henceforth "Lemieux"), page 28, FIG. 3.4. Commercial products using this architecture can be found in a number of FPGA families offered by Altera Corporation of San Jose, Calif.

Other FPGA cluster types with two levels of routing multiplexers are possible. In U.S. Pat. No. 6,975,139 to Pani, et al, (henceforth "Pani") another architecture is shown in FIG. 7. In that figure, one set of input wires 601-604 is shown coupled to first level multiplexers while another set of input wires 605-612 is shown coupled to second level multiplexers. Since no feedback interconnects are explicitly shown in conjunction with the figure, it is reasonable to assume they are included in the input wires 601-612. The input interconnects could reasonably be coupled exclusively to the second level multiplexers (I2) or to a combination of first and second level multiplexers (I2—pronounced "i-one-two," not "i-twelve"). Similarly, the feedback interconnects could reasonably be coupled exclusively to first level multiplexers (F1), exclusively to second level multiplexers (F2), or to a combination of first and second level multiplexers (F12—pronounced "ef-one-two," not "ef-twelve"). Thus the cluster combinations taught in Pani FIG. 7 could reasonably be inferred to be I12F1, I12F2, I12F12, I2F1 or I2F12 depending on the particular design choices made in assigning input and feedback connections in any given embodiment.

FPGA cluster types of three or more stages are also known in the art. In Pani, FIGS. 9-12 an I5F5 cluster is disclosed. In Lemieux, Chapter 2, Section 2.1, pages 9-17, highly routable switching networks are discussed in general, including references to a number of well known switching networks such as Clos networks and Benes networks. These networks typically have at least three stages of switches and can often be optimized for decreased numbers of switches and improved routablility by increasing the number of levels of switches that signals must pass through. Unfortunately, when such an approach is used in an FPGA cluster, the resulting performance degradation is undesirable to the point of being unacceptable in commercial FPGAs.

Since switches are typically constructed out of pass transistors or analogous floating gate structures in FPGAs, a series of switches and interconnects creates an RC network. As the number of series switches increases, both the resistance and capacitance also increase which greatly increases the propagation delay through the network. Adding buffers can help, but often the propagation delay through the buffers offsets the decrease in RC delays. At present, no three or more level clusters are used in commercially available products.

Figure 2C:
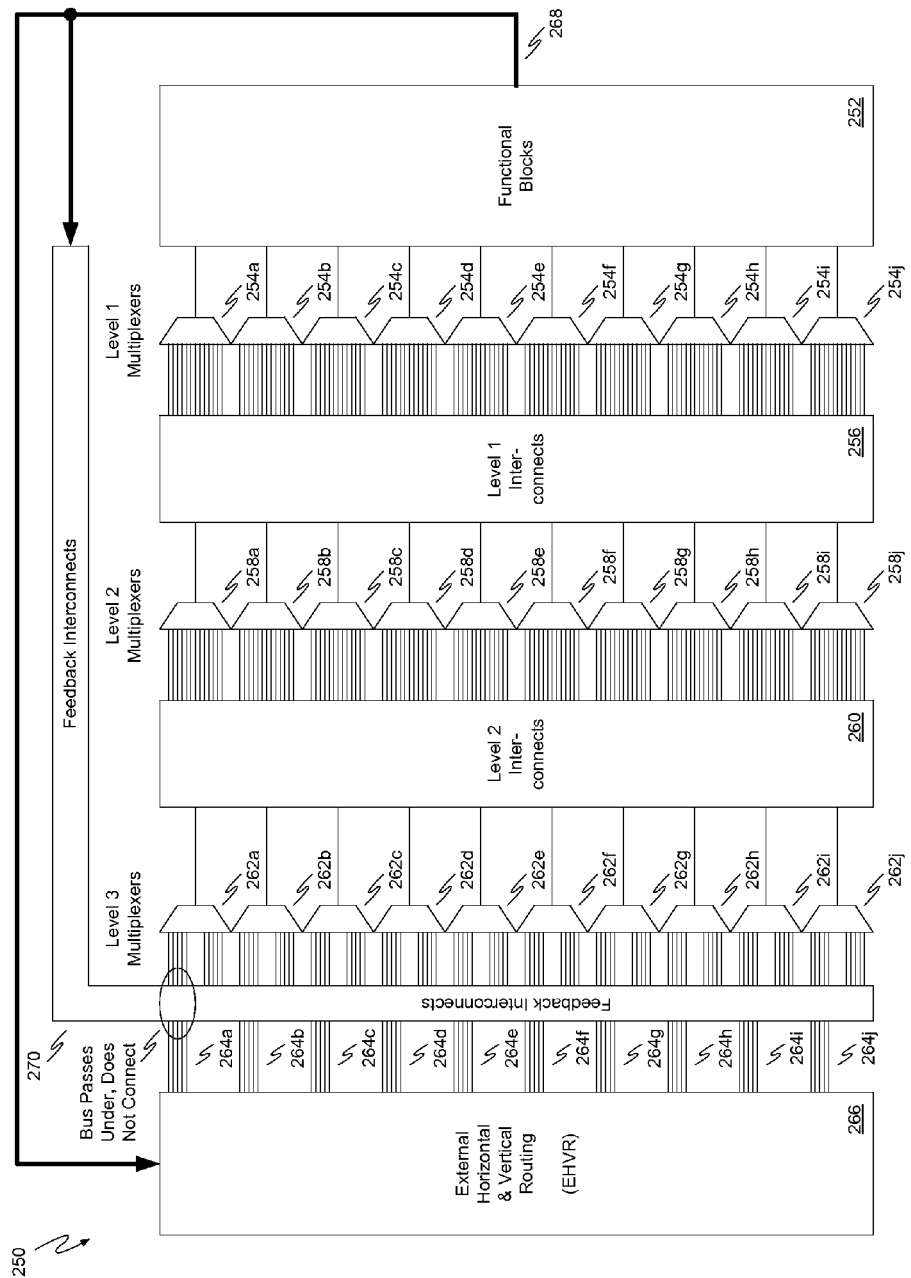

FIG. 2C shows an I3F3 type FPGA cluster 250 known in the prior art. Present in the drawing figure are functional blocks 252, level 1 multiplexers 254a through 254j, level 1 interconnects 256, level 2 multiplexers 258a through 258j, level 2 interconnects 260, level 3 multiplexers 262a through 262j, input busses 264a through 264j, EHVR 266, functional block output bus 268, and feedback interconnects 270. Similar to the clusters shown in FIG. 2A and FIG. 2B, the numbers of functional blocks, the numbers of first, second and third level multiplexers, the numbers of interconnects in the various interconnect busses, and the number of input channels on the various multiplexers are all a matter of design choice.

The data flow for external signals is through interconnects originating in EHVR 266 that are coupled to some of the data channels of the third level multiplexers 262a through 262j. The outputs of the level 3 multiplexers are coupled to the level 2 interconnections 260 which in turn are coupled to the data channels on the level 2 multiplexers 258a through 258j. The outputs of the level 2 multiplexers 258a through 258j are coupled to the level 1 interconnects 256 which are coupled to the data channels of the level 1 multiplexers 254a through 254j, which in turn have their outputs coupled to the inputs of the functional blocks 252. Thus the cluster inputs enter the internal cluster routing resources at the level 3 multiplexers (the I3 in I3F3).

The data flow for feedback signals starts from the outputs of the functional blocks 252 that form functional block output bus 268. Some or all of the interconnects in bus 268 (the number and destinations of the interconnects in functional block output bus 268 is a matter of design choice) are coupled to the feedback interconnects 270 which in turn are coupled to some of the data channels on the level 3 multiplexers. The outputs of the level 3 multiplexers are coupled to the level 2 interconnections 260 which in turn are coupled to the data channels on the level 2 multiplexers 258a through 258j. The outputs of the level 2 multiplexers 258a through 258j are coupled to the level 1 interconnects 256 which are coupled to the data channels of the level 1 multiplexers 254a through 254j, which in turn have their outputs coupled to the inputs of the functional blocks 252. Thus the feedback interconnects reenter the internal cluster routing resources at the level 3 multiplexers (the F3 in I3F3).

Level 1 interconnects 256, level 2 interconnects 260 and feedback interconnects 270 contain only routing wires. All of the routing decisions are implemented by control elements (not shown) governing the level 1 multiplexers 254a through 254j, level 2 multiplexers 258a through 258j and level 3 multiplexers 262a through 262j.

Figure 3:
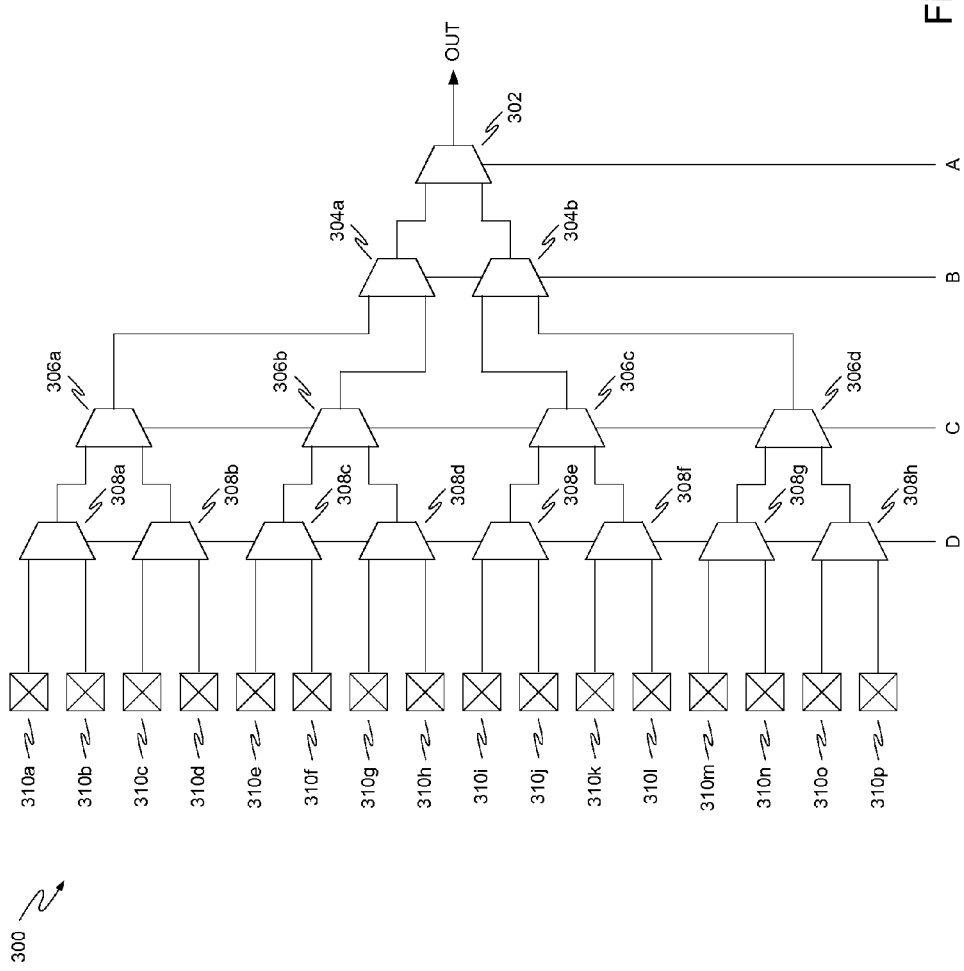

Turning to FIG. 3, a typical lookup table (or LUT) functional block 300 of the prior art is shown. LUT 300 has four inputs A, B, C and D and an output OUT and when programmed is capable of generating any four variable Boolean function where OUT=f(A,B,C,D) where "f" is the programmed Boolean function. Such a four input lookup table has been used as the LFG in many academic studies and commercial FPGAs. Typically a buffer or a sense amplifier (not shown) is present at the output to provide output drive.

LUT 300 comprises one first stage 2:1 multiplexer 302, two second stage 2:1 multiplexers 304a through 304b, four third stage 2:1 multiplexers 306a through 306d, eight fourth stage 2:1 multiplexers 308a through 308h, and sixteen control elements 310a through 310p. The select inputs of the first, second, third and fourth stage 2:1 multiplexers are coupled to inputs A, B, C, and D respectively. The output of first stage 2:1 multiplexer 302 is coupled to OUT while its two data channels are each coupled to one of the outputs of the two second stage 2:1 multiplexers 304a through 304b. The four data channels of the two second stage 2:1 multiplexers 304a through 304b are each coupled to one of the four outputs of third stage 2:1 multiplexers 306a through 306d. The eight data channels of the four third stage 2:1 multiplexers 306a through 304d are each coupled to one of the eight outputs of fourth stage 2:1 multiplexers 308a through 308h. The sixteen data channels of the eight fourth stage 2:1 multiplexers 308a through 308h are each coupled to one of the sixteen outputs of the control elements 310a through 310p. Collectively, this arrangement of 2:1 multiplexers forms a 16:1 multiplexer that presents the output of one of the sixteen control elements 310a through 310p to the output OUT.

Control elements 310a through 310p produce either a logic-0 or a logic-1 depending on how they are programmed. Boolean function f(A,B,C,D) of four variables will have sixteen unique input states, each with a corresponding output state. The value of that output state is placed in the control elements 310a through 310p such that the correct value is gated to the output OUT for the logic values presented at the inputs A, B, C and D. Thus the circuit 300 is said to "look up" the logic function rather than calculate it.

The nature of the control elements 310a through 310p will vary with the technology employed in constructing the FPGA. For example, in an SRAM-based FPGA each of the control elements 310a through 310p will typically be one bit of SRAM, with or without a buffer. Or in an antifuse based FPGA, each of the control elements would typically comprise a first antifuse coupled between the control element output and VCC and a second antifuse coupled between the control element output and ground. Or in a flash based FPGA, each of the control elements would typically comprise a first floating gate transistor coupled between the control element output and VCC and a second floating gate transistor coupled between the control element output and ground. In addition, some programming signals and circuitry may also be present in each control element.

It is worth noting that the propagation delay through LUT 300 of FIG. 3 will be different for each of the four inputs A, B, C and D. Input A will be the fastest, having the least propagation delay, since a logic transition on input A will only need to propagate through first stage multiplexer 302 to reach the output OUT. Input B will be the second fastest, having the second least propagation delay, since a logic transition on input B will need to propagate through one of the second stage multiplexers 304a through 304b as well as through first stage multiplexer 302 to reach the output OUT. In a similar manner, input C will be the third fastest, having the third least propagation delay, since a logic transition on input C will need to propagate through one of the third stage multiplexers 306a through 306d, through one of the second stage multiplexers 304a through 304b, as well as through first stage multiplexer 302 to reach the output OUT. Similarly, input D will be the slowest input, since an input transition on D will need to propagate through a multiplexer in each of the four stages.

Using circuit design techniques well known in the art such as adding buffers and inverters, using different styles of multiplexer, sizing transistors, decoding the select inputs, using level restorers, etc., LUT 300 can be optimized in many different ways. For example, LUT 300 can be designed for minimum area or minimum power or minimum propagation delay as a matter of design choice. Optimizing for minimum propagation delay can be done in a number of different ways. For example, LUT 300 can be optimized so that the average of the propagation delays from each of the four inputs A, B, C and D is minimized. Alternatively, the propagation delay of the fastest input can be minimized, even if this causes the average propagation delay of the four inputs A, B, C and D to be greater than the minimum for any given area and power budget.

In U.S. Pat. No. 7,443,198 to McCollum, et al, (henceforth "McCollum") a second look up table functional block is disclosed in FIG. 8A, FIG. 8B and FIG. 9. Since multiplexer 312 shown in FIG. 9 of McCollum is constructed in a manner similar to the first three multiplexer stages of LUT 300 in FIG. 3, the propagation delay through the McCollum look up table will be different for each of the four inputs A, B, C and D.

BRIEF DESCRIPTION OF THE DRAWING FIGURES

Figure 4A:
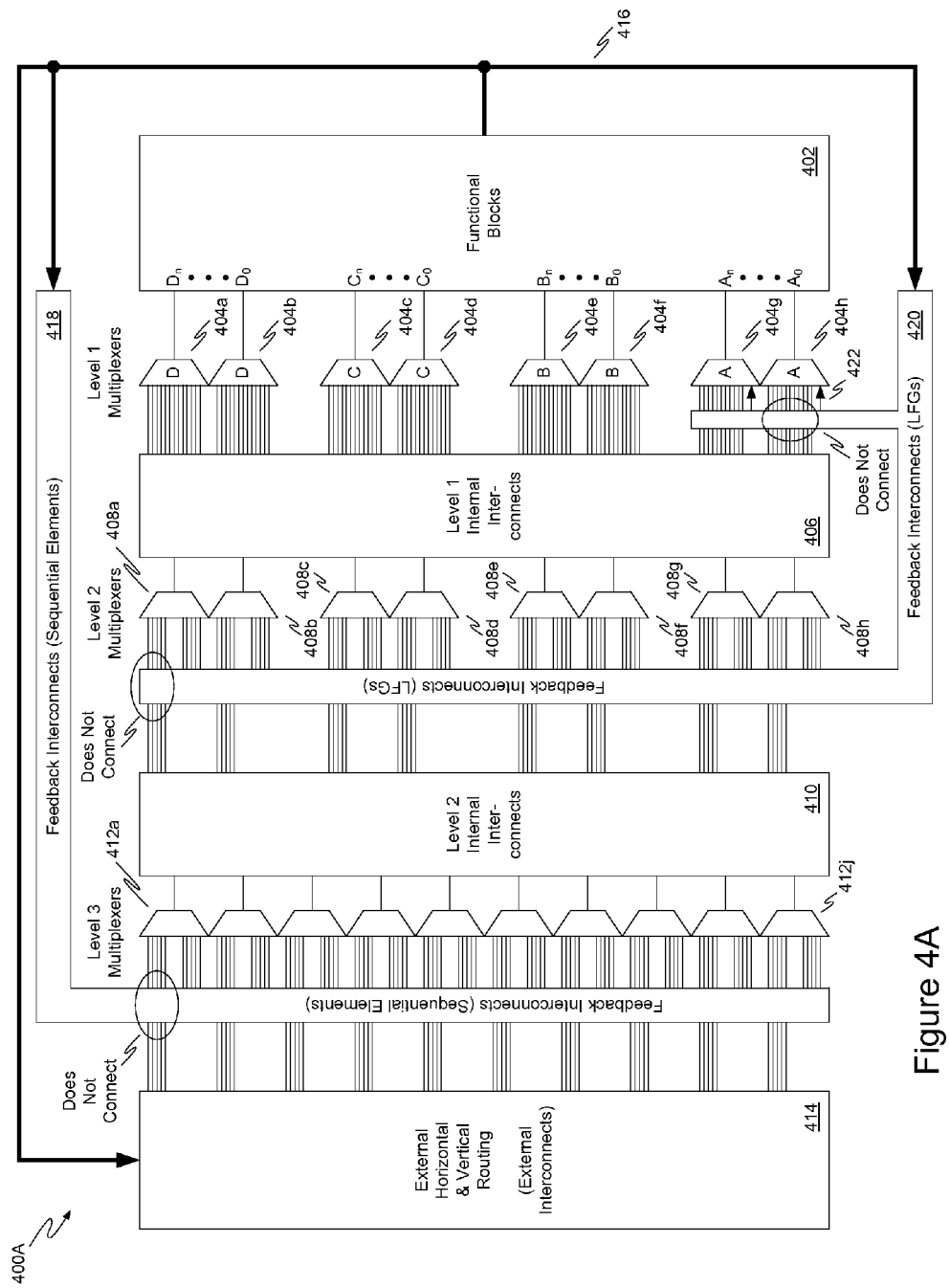
Figure 4B:
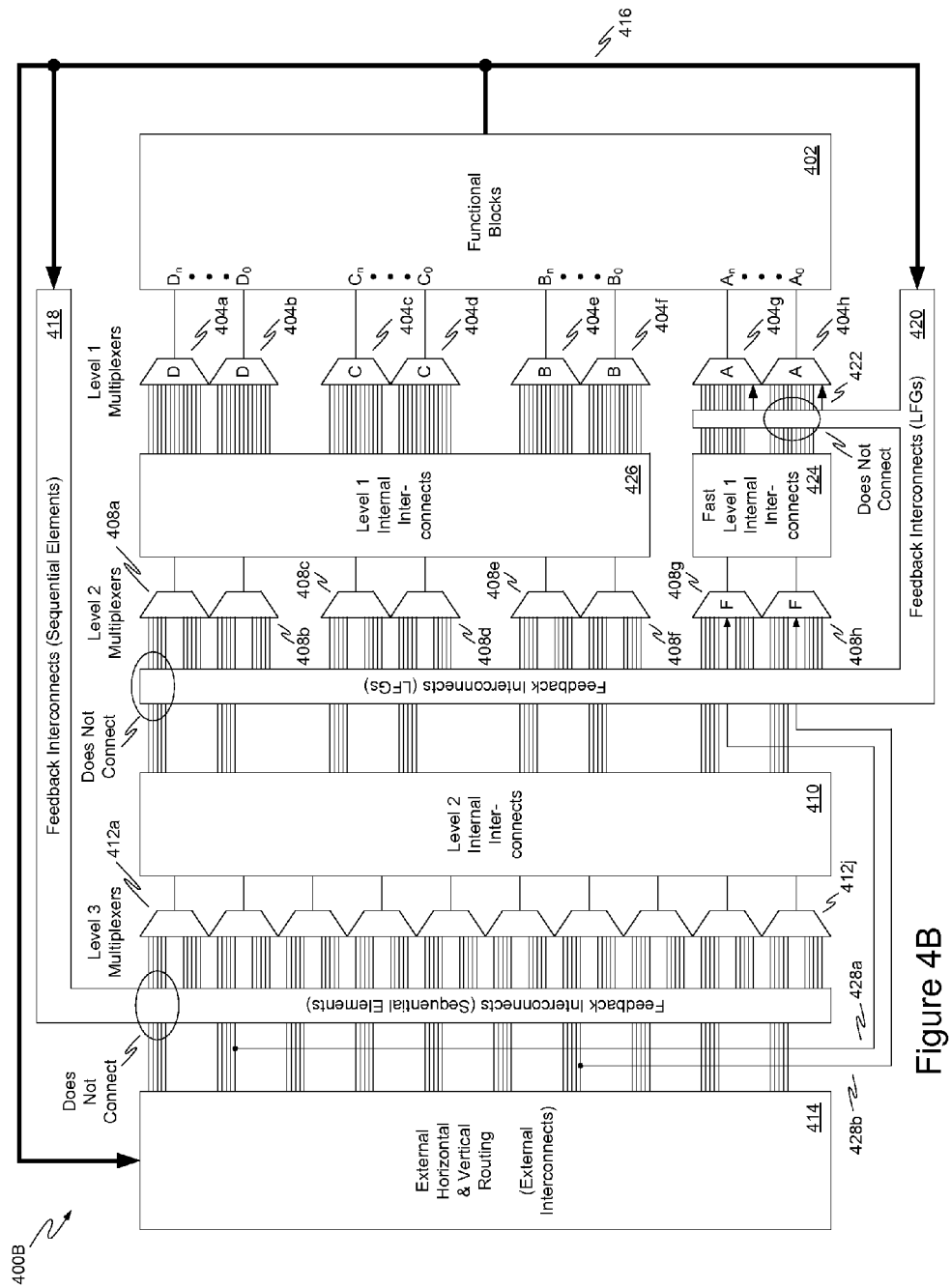
Figure 4C:
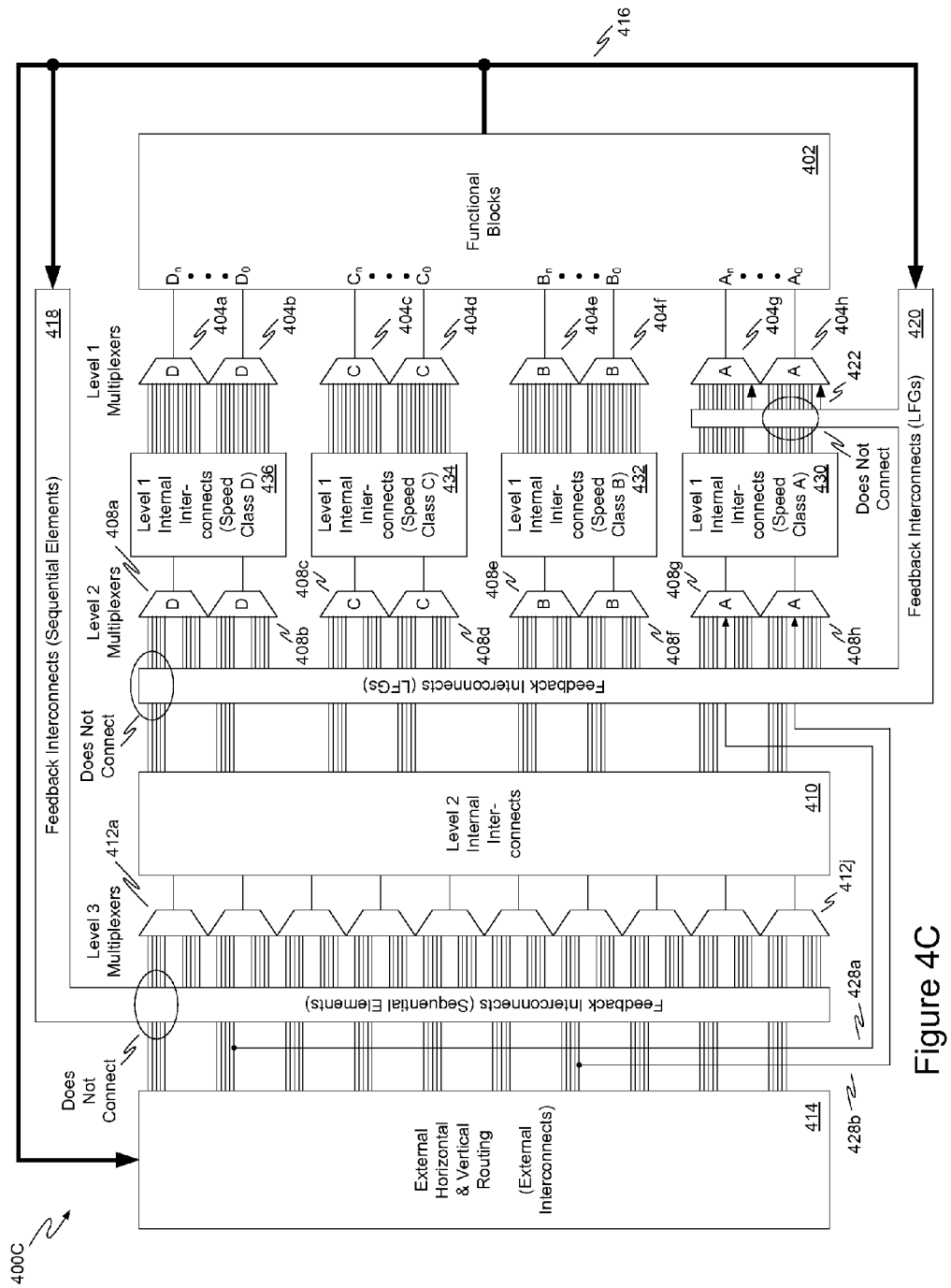
Figure 4D:
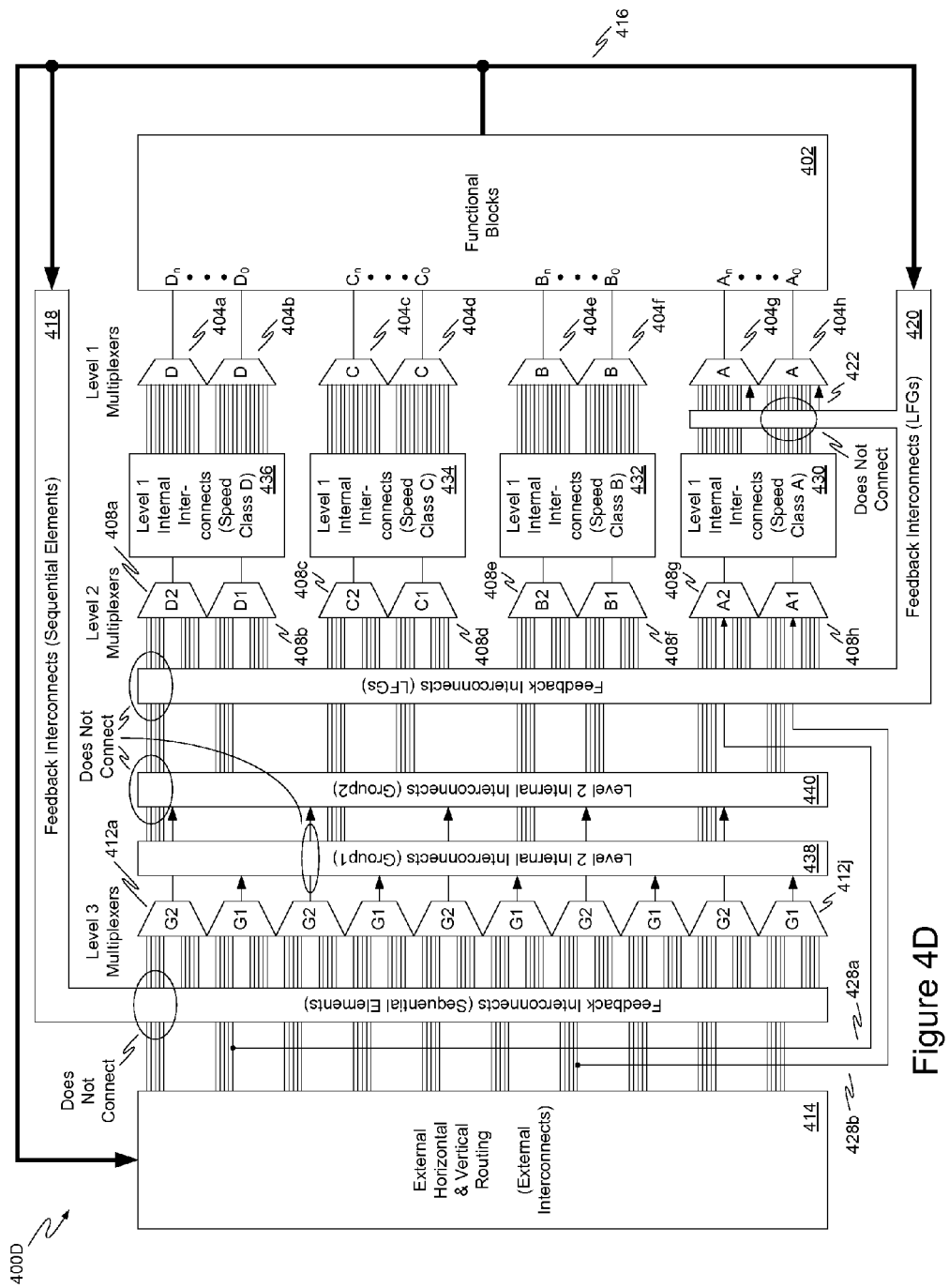
Figure 4E:
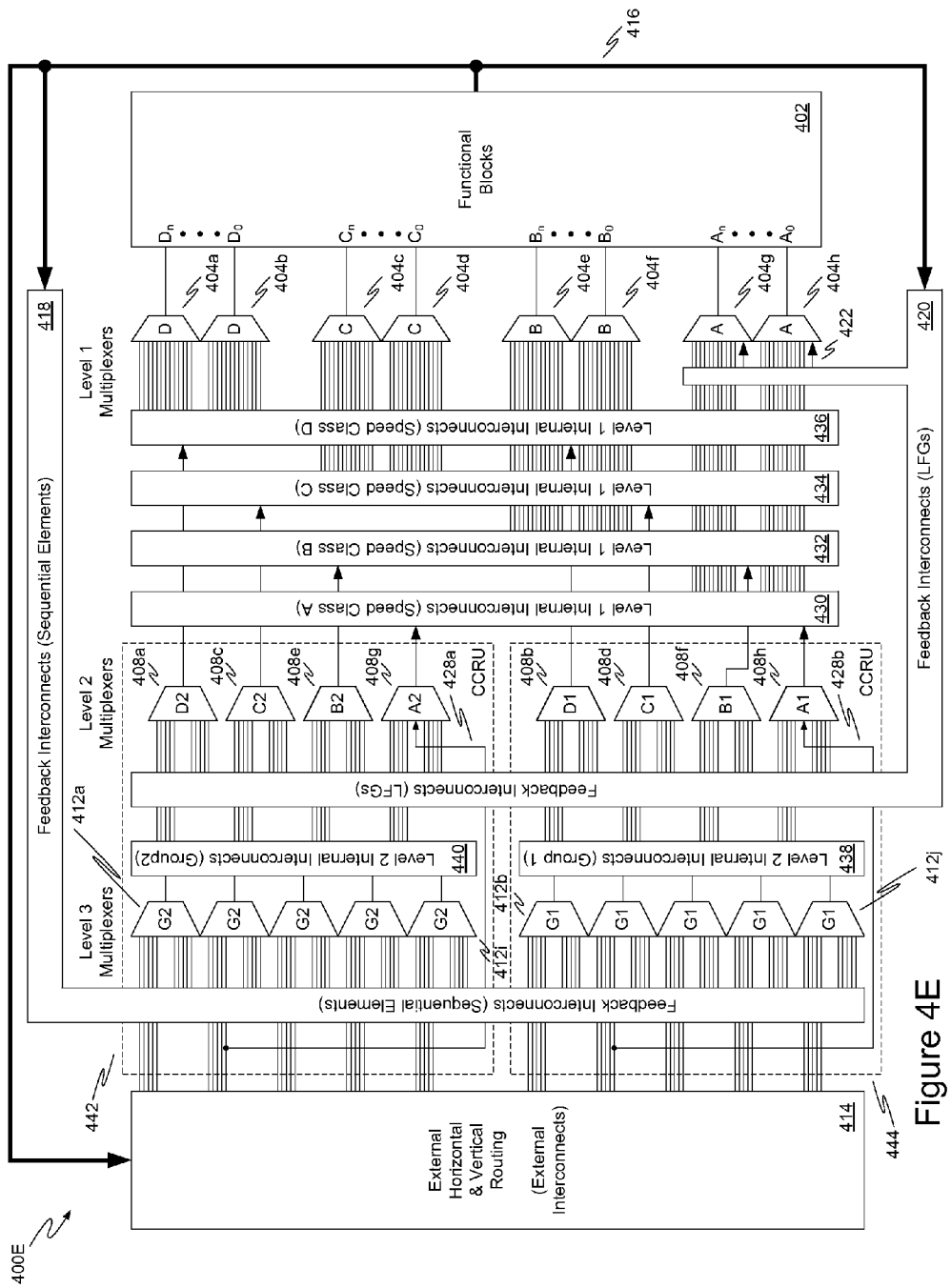
Figure 4F:
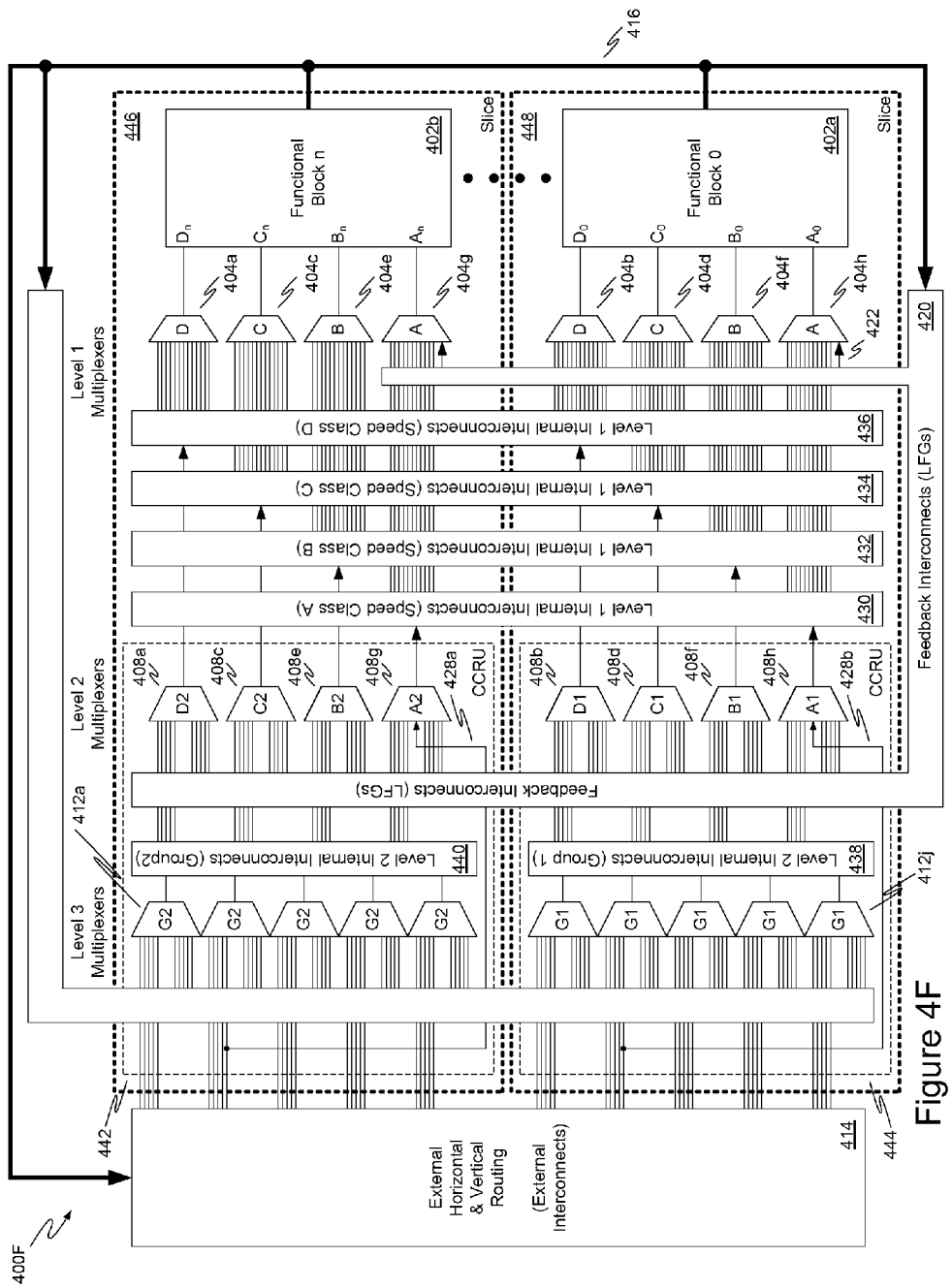
Figure 5:
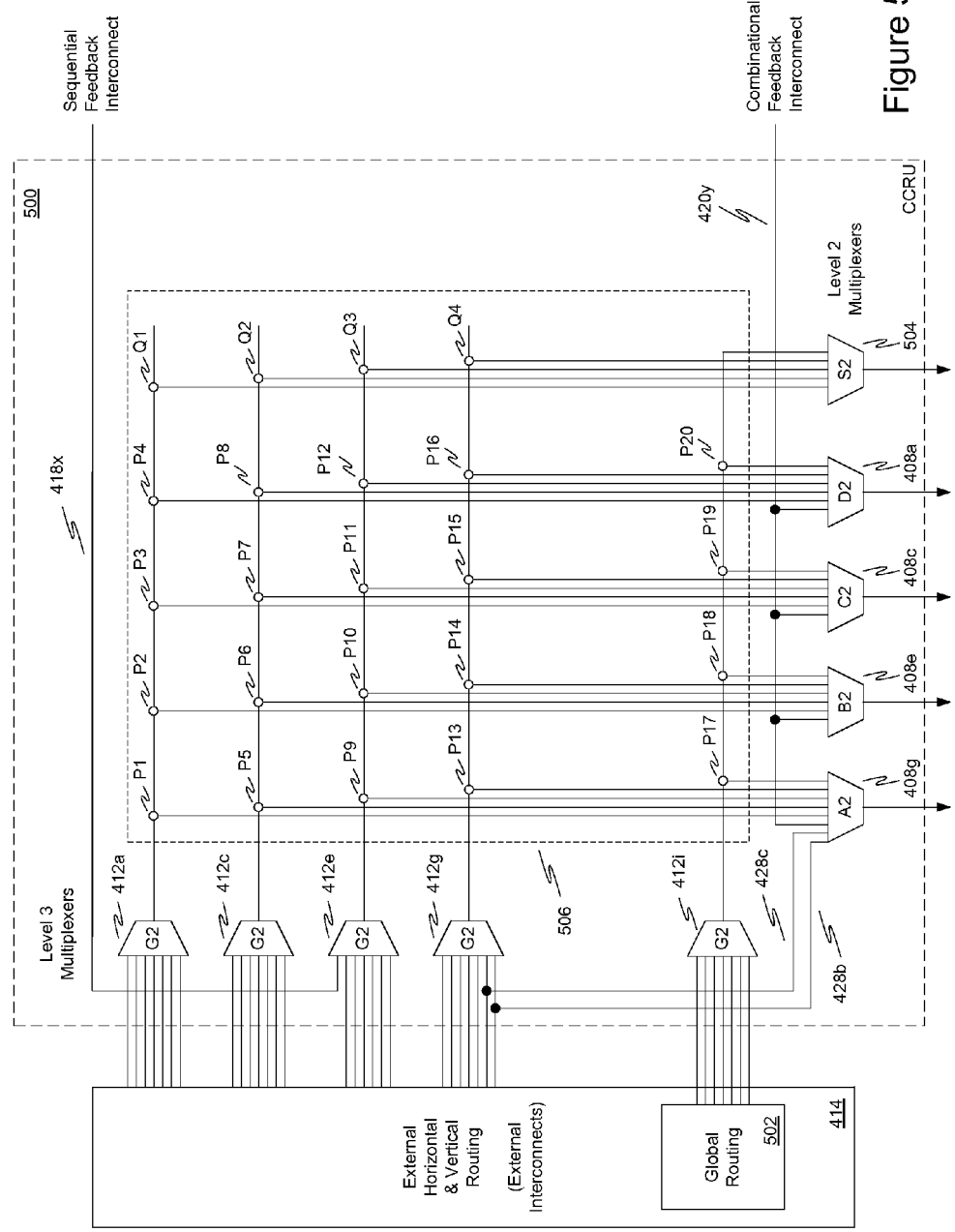

FIG. 1 is a diagram showing a logic cluster of the prior art.
FIG. 2A is a diagram showing a logic cluster of the prior art.
FIG. 2B is a diagram showing a logic cluster of the prior art.
FIG. 2C is a diagram showing a logic cluster of the prior art.
FIG. 3 is a diagram showing a look up table of the prior art.
FIG. 4A is a diagram showing a logic cluster of the present invention.
FIG. 4B is a diagram showing a logic cluster of the present invention.
FIG. 4C is a diagram showing a logic cluster of the present invention.
FIG. 4D is a diagram showing a logic cluster of the present invention.
FIG. 4E is a diagram showing a logic cluster of the present invention.
FIG. 4F is a diagram showing a logic cluster of the present invention.
FIG. 5 is a diagram showing details of a CCRU of the present invention.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

The present invention is a three level logic cluster which is organized in a manner that overcomes the performance limitations of the prior art. In comparison to the unacceptably slow I3F3 architecture shown in FIG. 2C the present invention has commercially acceptable performance while maintaining substantially the same area and routeability.

In the descriptions in this specification for the purpose of consistency and clarity of explanation only, the functional blocks in the logic cluster are assumed to include a mixture of LFGs (implemented as four input lookup tables or LUT4s) and sequential elements. In a preferred embodiment, an equal number of LUT4S and sequential elements are present, but this is not true in all embodiments. In the preferred embodiment, the LUT4 employed is of the type disclosed in McCollum FIG. 8A, FIG. 8B and FIG. 9, although other LUT4 designs like the one in FIG. 3 of this application may be used. The number of LUT inputs is not limited to four and LUTs of other widths such as LUT2, LUT3, LUT5, LUT6 or even wider LUTs fall within the scope of the present invention.

The present invention exploits the property of unequal propagation delays through the LUT4 from its various inputs. In the preferred embodiment, the propagation delay from the fastest input (by convention always the A input in this specification) to the output is minimized as much as area and power constraints will allow as a matter of design choice using circuit design techniques known in the art. Then the propagation delay from the second fastest input (by convention always the B input in this specification) to the output is minimized as much as area and power constraints will allow. In a similar manner, the third fastest and fourth fastest inputs (by convention the C and D inputs in this specification) to output delays are each minimized in turn. It is important to optimize the LUT4 to make the A input propagation delay as fast as possible, even if this results in the average delay of all four inputs being slower than if the optimization were done to make the average of the propagation delays as small as possible (which is done in some prior art architectures like Pani).

Lookup table LFGs have logically permutable inputs, meaning that the place and route software can route any signal to any input and then change the lookup function to compensate. FPGA design software can exploit this to increase routeability (like in Pani where all LUT inputs are assumed equal and the emphasis is on minimizing the number of routing switches), or the design software can exploit this to increase speed by routing critical signal paths through the fastest inputs—but it cannot do both because both directives are continually in conflict by competing for the fastest LUT input and only by coincidence can both objectives be achieved for the same LUT in a user design. Since the starting point I3F3 architecture is already extremely routable, the approach of using the design software to increase speed is used. Although only LUTs are discussed in this specification, persons of ordinary skill in the art will recognize that any other LFG with permutable inputs having different propagation delays would be suitable for use with the present invention.

FIG. 4A shows an I3F123 (pronounced "i-three-ef-one-two-three") logic cluster 400A of the present invention. Present in FIG. 4A are functional blocks 402, level 1 multiplexers 404a through 404h, level 1 interconnects 406, level 2 multiplexers 408a through 408h, level 2 interconnects 410, level 3 multiplexers 412a through 412j, EHVR 414, functional block output bus 416, feedback interconnects 418, and feedback interconnects 420.

The functional blocks 402 have inputs coupled to level 1 multiplexers 404a through 404h. The inputs are labeled $A_0$ through $A_n$, $B_0$ through $B_n$, $C_0$ through $C_n$, and $D_0$ through $D_n$. The number of functional blocks can vary as a matter of design choice, and in any given design n+1 are present (n is a positive integer). The $A_i$, $B_i$, $C_i$, and $D_i$ inputs are coupled to the A, B, C, and D inputs respectively of the LUT4s inside functional blocks 402. The handling of sequential control inputs will be discussed later in conjunction with FIG. 5.

Level 1 internal interconnects 406 comprise a number of routing wires. Each wire is coupled to the output of one of the level 2 multiplexers 408a through 408h as well as to one or more data channels of the level 1 multiplexers. The exact number of inputs and outputs and pattern of their connections will vary from embodiment to embodiment and is a matter of design choice.

Level 2 internal interconnects 410 comprise a number of routing wires. Each wire is coupled to the output of one of the level 3 multiplexers 412a through 412j as well as to one or more data channels of the level 2 multiplexers. The exact number of inputs and outputs and pattern of their connections will vary from embodiment to embodiment and is a matter of design choice.

EHVR 414 comprises a number of routing wires and other routing resources not shown such as multiplexers, switches and buffers. External interconnects originating in EHVR 414 are coupled to one or more of the data channels of the level 3 multiplexers. The exact number of external interconnects and the pattern of their connections will vary from embodiment to embodiment as a matter of design choice.

Functional blocks 402 have outputs coupled to the functional block output bus 416. The outputs of the LFGs are coupled to combinational interconnects and the outputs of the sequential inputs are coupled to sequential interconnects. The sequential interconnects can be coupled to either feedback interconnects 418, EHVR 414, or both, while the combinational interconnects can be coupled to either feedback interconnects 420, EHVR 414, or both.

In a preferred embodiment, the sequential feedback interconnects 418 only reenter the logic cluster internal routing at the level 3 multiplexers (the F3 in I3F123), while the combinational feedback interconnects 420 only reenter the logic cluster internal routing at the level 1 and level 2 multiplexers (the F12 in I3F123). Place and route experiments indicate that LUTs feed back into the same cluster far more frequently than sequential elements do. Also, F2 connections are more expensive than F3 connections (since an F2 connection must connect to multiple level 2 multiplexers while an F3 connection needs to connect to only one level 3 multiplexer for equivalent routeability), so only the feedback connections that improve speed significantly (the combinational ones) reenter as F2 connections.

Since the combinational F2 connections to the level 2 multiplexers are costly in terms of silicon area, in a preferred embodiment some selective depopulation of the level 2 multiplexers is done to recoup the area required. Depopulation means removing data channels from the group of level 2 multiplexers eliminating some routing possibilities. In the I3F3 cluster 250 of FIG. 2C, each level 3 multiplexer input can reach 100% of the LUT4 inputs. By reducing size of the level 2 multiplexers so that each level 3 multiplexer can reach 85% of the LUT4 inputs on average and no less than 75% in any given instance, the area penalty incurred by the additional F2 connections is removed with no loss of performance and almost no loss of routing flexibility.

A few of the combinational feedback interconnects 420 are also fed back as F1 connections, but only to the level 1 multiplexers associated with the fastest A inputs of the LUT4s. An exemplary of one of these connections is indicated by reference number 422 in the drawing figure. From a routeability perspective, these are redundant with respect to the F2 connections (i.e., there is more than one way to reach the involved level 1 multiplexers) but the connections provide an even faster option for the place and route software to improve the speed of critical paths. No depopulation of the level 1 multiplexers is attempted to recoup the additional area cost of these connections since that would greatly harm routeability.

FIG. 4A uses the convention from earlier drawing figures that busses drawn as wires "pass under" interconnects drawn as polygons (here the feedback interconnects 418 and 420) without connecting. An exemplary instance of each of the three cases is labeled "Does Not Connect" in the diagram. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, the interconnections to the various level 1, level 2 and level 3 multiplexers are a matter of design choice. Such skilled persons will realize that other connections not shown in FIG. 4A or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 4B shows an I23F123 (pronounced "i-two-three-ef-one-two-three") logic cluster 400B of the present invention. Present in FIG. 4B are functional blocks 402, level 1 multiplexers 404a through 404h, level 2 multiplexers 408a through 408h, level 2 interconnects 410, level 3 multiplexers 412a through 412j, EHVR 414, functional block output bus 416, and feedback interconnects 418, 420 and 422 previously discussed. FIG. 4B is identical to FIG. 4A except that level 1 interconnects 406 have been replaced by fast level 1 interconnects 424 and level 1 interconnects 426 and interconnections 428a and 428b have been added.

In order to further improve performance over the embodiment 400A of FIG. 4A, a group of level 2 multiplexers represented by multiplexers 408g and 408h (and labeled with an "F" for "fast") are selected as fast level 2 multiplexers. The outputs of the fast level 2 multiplexers 408g and 408h are coupled to fast level 1 internal interconnects 424, while the outputs of the remaining level 2 multiplexers 408a through 408f are coupled to level 1 interconnects 426. Fast level 1 internal interconnects 424 are coupled only to data channels on level 1 multiplexers (represented by 404g and 404h) associated with the fastest (A) inputs to the LUT4s, while the remaining level 1 interconnects 426 are coupled only to data channels on the level 1 multiplexers associated with the B, C and D inputs.

Several factors contribute to the speed improvement of the fast level 1 internal interconnects 424. First, since they are only coupled to level 1 multiplexers associated with the fastest (A) inputs to the LUT4s, they have an intrinsic speed advantage relative to signals entering the LUT4s through the B, C or D inputs. Second, since they only connect to one quarter of the total number of level 1 multiplexers (multiplexers 404g and 404h in FIG. 4B), there are substantially fewer data channels adding capacitance to the routing wires in the fast level 1 internal interconnects 424. By comparison, the level 1 internal interconnects 426 couple to the level 1 multiplexers coupled to the B inputs, the C inputs and the D inputs to maintain routeability. Third, since the level 1 multiplexers associated with the fastest (A) inputs to the LUT4s have fewer data channels, their output capacitance on the routing wire to the LUT4 A inputs is reduced as well. Fourth, a LUT4 typically has at most one speed critical path routed through it, so creating a fast class of connection paths to the A inputs of the LUT4s greatly increases the overall performance of the architecture by giving the timing driven place and route tool (or tools) a fast option for the one signal that really needs to be fast in the large majority of instances. Fifth, in some embodiments the size of the transistors in the fast level 2 multiplexers can be increased, further improving the speed. Thus, the fast level 1 internal interconnects 424 are a fast class of level 1 internal interconnects due to their architectural context rather than the routing wires themselves being intrinsically faster than their counterparts the routing wires in the level 1 internal interconnects 426.

All of the paths starting from the data channel inputs of the fast level 2 multiplexers 408g and 408h through the fast level 1 internal interconnects 424 and level 1 multiplexers 404g and 404h through the A inputs to the LUT4 outputs form a first group of select signal paths of a first speed class in FIG. 4B. Similarly, all of the paths starting from the data channel inputs of the level 2 multiplexers 408a through 408f through the level 1 internal interconnects 426 and level 1 multiplexers 404a through 404f through the B, C and D inputs to the LUT4 outputs form a second group of select signal paths of a second speed class in FIG. 4B.

A few external interconnects 428a and 428b that are coupled to data channels on level 3 multiplexers 412a through 412j are now additionally coupled to data channels on the fast level 2 multiplexers 408g and 408h. These are not new external connections, rather they are additional points of connection for a few of the existing I3 external interconnects, effectively bypassing the level 3 multiplexers and creating an I23 topology. This allows the timing driven place and route tool (or tools) a faster way to get to the fastest speed class of select signal paths.

As shown in the embodiment 400B of FIG. 4B, there is no interaction between the fast level 1 internal interconnects 424 and the level 1 interconnects 426. In some embodiments a degree of interconnection between fast level 1 internal interconnects 424 and the level 1 interconnects 426 is allowed as a matter of design choice.

FIG. 4B uses the convention from earlier drawing figures that busses drawn as wires "pass under" interconnects drawn as polygons (here the feedback interconnects 418 and 420) without connecting. An exemplary instance of each of the three cases is labeled "Does Not Connect" in the diagram. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, and the interconnections to the various level 1, level 2 and level 3 multiplexers are a matter of design choice. Such skilled persons will realize that other connections not shown in FIG. 4B or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 4C shows an I23F123 logic cluster 400C of the present invention. Present in FIG. 4C are functional blocks 402, level 1 multiplexers 404a through 404h, level 2 multiplexers 408a through 408h, level 2 internal interconnects 410, level 3 multiplexers 412a through 412j, EHVR 414, functional block output bus 416, feedback interconnects 418, 420 and 422, and interconnects 428a and 428b previously discussed. FIG. 4C is identical to FIG. 4B except that level 1 internal interconnects 424 and 426 have been replaced by level 1 internal interconnects 430, 432, 434 and 436.

In order to further improve the area with respect to the embodiment 400B of FIG. 4B, the level 2 multiplexers are combined into four groups each associated with one of the LUT4 input types. Thus in FIG. 4C level 2 multiplexers 408g and 408h represent the group associated with the A inputs and are labeled "A" in the figure, multiplexers 408e and 408f represent the group associated with the B inputs and are labeled "B" in the figure, multiplexers 408c and 408d represent the group associated with the C inputs and are labeled "C" in the figure, and multiplexers 408a and 408b represent the group associated with the D inputs and are labeled "D" in the figure.

Level 1 internal interconnects (speed class A) 430 are shown coupled between the outputs of the "A" level 2 multiplexers 408g and 408h and the data channels of the representative "A" level 1 multiplexers 404g and 404h. Level 1 internal interconnects (speed class B) 432 are shown coupled between the outputs of the "B" level 2 multiplexers 408e and 408f and the data channels of the representative "B" level 1 multiplexers 404e and 404f. Level 1 internal interconnects (speed class C) 434 are shown coupled between the outputs of the "C" level 2 multiplexers 408c and 408d and the data channels of the representative "C" level 1 multiplexers 404c and 404d. Level 1 internal interconnects (speed class D) 436 are shown coupled between the outputs of the "D" level 2 multiplexers 408a and 408b and the data channels of the representative "D" level 1 multiplexers 404a and 404b.

Effectively this creates four different speed classes (A, B, C and D) of level 1 internal interconnect and by extension four different speed classes of select signal paths starting at the inputs of the data channels of the level 2 multiplexers and terminating at the outputs of the LUT4 function generators. The area savings in embodiment 400C of FIG. 4C is due to the need for fewer input channels in the speed class A, B, C and D level 1 multiplexers. Since the speed class A, B, C and D level 2 multiplexers only have to couple to data channels on speed class A, B, C and D level 1 multiplexers respectively, all of the speed classes get the same area and speed improvement that that fast speed class got in embodiment 400B of FIG. 4B. Although in embodiment 400C the primary difference in the speed classes is created by the LUT4 propagation delays, this can be enhanced by both the circuit design of the multiplexers and the layout of the routing lines. For example, larger transistors could be used for all of the class A level 1 and level 2 multiplexers relative to the other classes to further enhance the fastest connections.

As shown in the embodiment 400C of FIG. 4C, there is no interaction between the level 1 internal interconnects 424 and the level 1 interconnects 426. In some embodiments a degree of interconnection between the class A, B, C and D level 1 internal interconnects 430, 432, 434 and 436 is allowed as a matter of design choice.

To maintain a high level of routeability, the number of level 2 multiplexers in any of the speed classes A, B, C and D must be at least as large as the number of level 1 multiplexers in the same speed class. The number of level 1 multiplexers is equal to the number of inputs of that class type which in turn is equal to the number of LUT4s in the logic cluster. We will define the number of LUT4s as k. Thus k=n+1 as discussed in conjunction with FIG. 4A.

Place and route experiments in 90 nm and 65 nm flash based FPGA configuration technology were used to determine the optimal value of k. It was determined that the preferred embodiment of the present invention is smaller in area to a comparable I2F1 architecture in the range 7<=k<=18 and to a comparable I1F1 architecture for k<=14. For the range 8<=k<18, the preferred embodiment is faster than both a comparable I2F1 architecture and a comparable I1F1 architecture. Further experiments on the architecture of the present invention utilizing determined that the optimal range for both performance and area is 11<=k<=14. The preferred embodiment uses k=12 (instead of k=11, k=13 or k=14) because of its larger factorization and better divisibility with small numbers, the later in particular making the design of an optimal set of multiplexers easier. In a preferred embodiment, the optimal number of second level multiplexers of each speed class was also determined to be equal to k.

FIG. 4C uses the convention from earlier drawing figures that busses drawn as wires "pass under" interconnects drawn as polygons (here the feedback interconnects 418 and 420) without connecting. An exemplary instance of each of the three cases is labeled "Does Not Connect" in the diagram. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, and the interconnections to the various level 1, level 2 and level 3 multiplexers are a matter of design choice. While specific values of k were cited for a particular configuration technology at particular process nodes, the value of k may differ at other process nodes and with different configuration technologies used at different process nodes and as a result of different design choices and is not limited to the range 11<=k<=14. Such skilled persons will realize that other connections not shown in FIG. 4C or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 4D shows an I23F123 logic cluster 400D of the present invention. Present in FIG. 4D are functional blocks 402, level 1 multiplexers 404a through 404h, level 2 multiplexers 408a through 408h, level 3 multiplexers 412a through 412j, EHVR 414, functional block output bus 416, feedback interconnects 418, 420 and 422, interconnects 428a and 428b, and level 1 internal interconnects 430, 432, 434 and 436 previously discussed. FIG. 4D is identical to FIG. 4C except for three changes.

In the first change, the level 3 multiplexers 412a through 412j have been divided into two representative groups. Group 1 comprises level 3 multiplexers 412b, 412d, 412f, 412h and 412j (labeled G1 in the drawing figure) and group 2 comprises level 3 multiplexers 412a, 412c, 412e, 412g and 412i. While two groups are shown in FIG. 4D, more may be present as will be discussed below.

In the second change, the level 2 internal interconnects 410 have been replaced by level 2 internal interconnects (group 1) 438 that are only coupled to the outputs of the group 1 level 3 multiplexers, and level 2 internal interconnects (group 2) 440 that are only coupled to the outputs of group 2 level 3 multiplexers. There will be as many groups of level 2 internal interconnects as there are groups of level 3 multiplexers.

In the third change, the level 2 multiplexers are divided into groups corresponding to each of the level 3 multiplexer groups and each of the level 2 internal interconnect groups while still retaining their speed classification. Thus level 2 multiplexers 408h, 408i, 408f, 408e, 408d, 408c, 408b and 408a are now shown labeled A1, A2, B1, B2, C1, C2, D1 and D2 respectively.

The importance of the embodiment 400D lies in the physical transformations that the logical organizing of the level 2 and level 3 multiplexers and the level 2 internal interconnects allow. These will be discussed in conjunction with FIG. 4E and FIG. 4F.

FIG. 4D uses the convention from earlier drawing figures that busses drawn as wires "pass under" interconnects drawn as polygons (here the feedback interconnects 418 and 420 and the level 2 internal interconnects 438 and 440) without connecting. An exemplary instance of each of the five cases is labeled "Does Not Connect" in the diagram. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, and the interconnections to the various level 1, level 2 and level 3 multiplexers are a matter of design choice. Such skilled persons will realize that other connections not shown in FIG. 4D or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 4E shows an I23F123 logic cluster 400E of the present invention. Present in FIG. 4E are functional blocks 402, level 1 multiplexers 404a through 404h, level 2 multiplexers 408a through 408h, level 3 multiplexers 412a through 412j, EHVR 414, functional block output bus 416, feedback interconnects 418, 420 and 422, interconnects 428a and 428b, level 1 internal interconnects 430, 432, 434 and 436, and level 2 internal interconnects 438 and 440 previously discussed. FIG. 4E is functionally identical to FIG. 4D although the components have been reorganized.

In FIG. 4E, the level 2 and level 3 multiplexers associated with each of the representative groups (group 1 and group 2) have been reorganized to be physically adjacent to the other components of the group. Thus level 2 multiplexers 408a, 408c, 408e, and 408g (also labeled D2, C2, B2 and A2 respectively), level 2 internal interconnects (group 2) 440, level 3 multiplexers 412a, 412c, 412e, 412g and 412i, (also labeled G2) and interconnect 428a are all grouped together into a cross coupled routing unit (CCRU) indicated by the light dashed line labeled 442. Similarly, level 2 multiplexers 408b, 408d, 408f, and 408h (also labeled D1, C1, B1 and A1 respectively), level 2 internal interconnects (group 1) 438, level 3 multiplexers 412b, 412d, 412f, 412g and 412j, (also labeled G2) and interconnect 428b are all grouped together into a cross coupled routing unit (CCRU) indicated by the light dashed line labeled 444.

In the drawing figure, there are no interconnections between CCRU 442 and CCRU 444 inside the logic cluster. This means that in a physical integrated circuit, each of the CCRUs 442 and 444 can have all their components laid out adjacent to one another in a small area. Unlike the organization of FIG. 4D where the level 2 interconnects 438 and 440 run the entire width of the logic cluster, in FIG. 4E the level 2 interconnects 438 and 440 are localized within CCRU 444 and 442 respectively. This greatly reduces the amount of capacitance on the level 2 internal interconnect routing wires resulting in a significant performance increase.

In FIG. 4E, the level 1 internal interconnects 430, 432, 434 and 438 have also been redrawn to maintain the required connectivity. In this drawing figure they now appear to span the entire cluster. Persons of ordinary skill in the art will realize that this really was always the case. Functional blocks are constructed individually in a small area with the A, B, C and D inputs for each functional block physically close together. Representing the functional blocks 402 as a unit with inputs $A_0$ through $A_n$ clustered together, inputs $B_0$ through $B_n$ clustered together, inputs $C_0$ through $C_n$ clustered together, and inputs $D_0$ through $D_i$, grouped together was an abstraction made for clarity of understanding with respect to the grouping of level 1 internal interconnects into speed classes. The preferred physical organization will be discussed in conjunction with FIG. 4F.

FIG. 4E uses the convention from earlier drawing figures that individual wires as well as busses drawn as wires "pass under" interconnects drawn as polygons (here the feedback interconnects 418 and 420, the level 1 internal interconnects 430, 432, 434 and 436, and the level 2 internal interconnects 438 and 440) without connecting. The labeling of exemplary instances of each case has been removed in this and subsequent drawing figures to avoid cluttering them. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, the interconnections to the various level 1, level 2 and level 3 multiplexers, and the number of CCRU blocks are a matter of design choice. Such skilled persons will realize that other connections not shown in FIG. 4E or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 4F shows an I23F123 logic cluster 400F of the present invention. Present in FIG. 4F are level 1 multiplexers 404a through 404h, level 2 multiplexers 408a through 408h, level 3 multiplexers 412a through 412j, EHVR 414, functional block output bus 416, feedback interconnects 418, 420 and 422, interconnects 428a and 428b, level 1 internal interconnects 430, 432, 434 and 436, and level 2 internal interconnects 438 and 440 previously discussed. FIG. 4F is functionally identical to FIG. 4D and FIG. 4E although the components have been reorganized and the functional blocks 402 are now represented by two representative functional blocks 402a and 402b.

In FIG. 4F, two functional blocks 402a and 402b are shown, though any number may be present. Functional block 0 labeled 402a is shown with inputs $A_0$, $B_0$, $C_0$ and $D_0$ coupled to the outputs of level 1 multiplexers 404h, 404f, 404d and 404b respectively, and functional block n labeled 402b is shown with inputs $A_n$, $B_n$, $C_n$ and $D_n$ coupled to the outputs of level 1 multiplexers 404g, 404e, 404c and 404a respectively.

In logic cluster 400F, the number of CCRU blocks is made equal to the number of functional blocks. Each of the CCRU blocks is grouped together with one of the functional blocks and its associated level 1 multiplexers into a single block called a slice. Two slices 446 and 448 are indicated by heavy dotted lines. Slice 446 comprises CCRU 442, functional block 402b, and level 1 multiplexers 404a, 404c, 404e and 404g, and slice 448 comprises CCRU 444, functional block 402a, and level 1 multiplexers 404b, 404d, 404f and 404h.

In a practical FPGA integrated circuit, a cluster comprises a number of physically adjacent slices abutted together and laid out in parallel. By making the CCRU and the functional block have the same width in one physical dimension, significant modularity can be achieved. For example, if place and route experiments or some other factor indicate a different number of functional blocks per cluster is desirable, the amount of rework required to change the cluster size is reduced. As discussed in conjunction with FIG. 4D, the number of functional blocks (and thus the number of CCRU blocks) in a preferred embodiment is 12.

FIG. 4F uses the convention from earlier drawing figures that individual wires as well as busses drawn as wires "pass under" interconnects drawn as polygons (here the feedback interconnects 418 and 420, the level 1 internal interconnects 430, 432, 434 and 436, and the level 2 internal interconnects 438 and 440) without connecting. The labeling of exemplary instances of each case has been removed in this drawing figure to avoid cluttering. In general, this style of drawing figure is intended to emphasize the interrelationships between classes of components and interconnects without specific reference to any particular numbers or detailed circuit connections.

Persons of ordinary skill in the art will appreciate that the numbers of functional blocks, the number of level 1, level 2 and level 3 multiplexers, the number of data channels on each level 1, level 2 and level 3 multiplexer, the interconnections to the various level 1, level 2 and level 3 multiplexers, the number of CCRU blocks, and the number of slices are a matter of design choice. Such skilled persons will realize that other connections not shown in FIG. 4F or described in the specification will be present in many practical embodiments of the invention. Circuits such as carry chains, sequential element control signals and their routing multiplexers and interconnects, other functional block inputs (like bypass inputs allowing connection to the data input of the sequential element while avoiding the LUT4 and its level 1 multiplexers), etc., may be present and their presence or absence is in no way limiting of the present invention.

FIG. 5 shows a preferred embodiment CCRU 500. CCRU 500 is a superset of CCRU 442 of FIGS. 4E and 4F shown in more detail. In particular, CCRU 500 comprises additional circuitry for handling special global and high fan-out signals like sequential element control signals. Present in FIG. 5 are previously discussed level 2 multiplexers 408a, 408c, 408e and 408g, level 3 multiplexers 412a, 412c, 412e, 412g and 412i, EHVR 414, feedback interconnect wire 418x (discussed as part of feedback interconnects 418), feedback interconnect wire 420y (discussed as part of feedback interconnects 420), and interconnect 428b. Also shown in FIG. 5 are interconnect 428c, global routing 502, level 2 multiplexer 504, level 2 internal interconnects 506, connect points P1 through P20, and connect points Q1 through Q4. In a preferred embodiment, two interconnects 428b and 428c couple to data channels on the level 3 multiplexer 412g and to data channels on level 2 multiplexer 408g.

In FIG. 5, the global routing 502 (not shown in any prior drawing figure) is broken out separately from the remainder of the FPGA routing architecture external to the cluster that is still contained in EHVR 414. The global routing resources are for signals that fan out to a large number of destinations. Their scope can be limited to a small region comprising a few logic clusters or span the entire FPGA. They are often used to carry sequential element control signals such as clocks, sets, resets, enables, and loads since often in user designs many sequential elements are controlled in parallel by the same signals.

Thus in FIG. 5, level 3 multiplexers 412a, 412c, 412e and 412g route general purpose logic signals while level 3 multiplexer 412i routes the sequential element control signals. Connect points P1 through P20 and Q1 through Q4 define the connectivity of the level 2 internal interconnects 506. Connect points are an abstraction of the reasonable hard wired connections between the outputs of level 3 multiplexers 412a, 412c, 412e, 412g and 412i and the various data channels on level 2 multiplexers 408a, 408c, 408e, 408g and 504. If the connect point makes a connection between the intersecting lines, the connect point is said to be populated. If the connect point does not make a connection, the connect point is said to be depopulated. Thus when the CCRU is designed, the various connect points are either populated or depopulated as a matter of design choice. Once the population decisions have been made, the actual wires on the FPGA integrated circuit are then routed in a physically efficient manner that will not resemble the pattern of wires shown in FIG. 5 except by coincidence.

Populating connect points is desirable, because it increases routeability. However, each populated connect point adds a data channel to the associated level 2 multiplexer in addition to adding capacitance the output of the associated level 3 multiplexer reducing speed which is undesirable. These factors need to be balanced in any architecture and many different population patterns can be utilized as a matter of design choice.

Connect points P1 through P16 (shown inside level 2 interconnects 440) determine the routeability of the general logic signals originating in EHVR 414 to the functional block inputs. Connect points P17 through P20 allow the global routing to connect to function block logic inputs if some are populated. This can be useful in applications where a high fan out signal needs to connect to combinational logic instead of to a sequential element.

Level 2 multiplexer 504 is used to route the global signal selected by level 3 multiplexer 412i to level 1 multiplexers (not shown in any of the figures) coupled to the functional block inputs used for the sequential element control signals (not shown in any of the figures). The output of level 3 multiplexer 412i is always coupled to a data channel of level 2 multiplexer 504.

Connect points Q1 through Q4 (shown inside level 2 interconnects 506) determine the routeability of the general logic signals originating in EHVR 414 to the sequential element control inputs of the functional block inputs if some are populated. This can be useful in applications where a subsystem uses a small number of sequential elements and it is more economical to drive the sequential element control signals using general logic signals instead of one of the resources in global routing 502.

In a currently preferred embodiment, the population of the connect points varies slightly from one CCRU block to another. On average 14 of the connect points P1 through P16 are populated with the number ranging from 13 to 15 depending on the individual CCRU. Also, 2 of the 4 connect points P17 through P20 are populated, though the two connections will vary from one CCRU to another. Similarly, 2 of the 4 connect points Q1 through Q4 are populated, though once again the two connections will vary from one CCRU to another. In one exemplary CCRU in a currently preferred embodiment of the present invention, the connect points P2, P3, P4, P5, P6, P7, P8, P9, P10, P11, P13, P14, P15, P16, P19, P20, Q1 and Q2 are populated while the connect points P1, P12, P17, P18, Q3 and Q4 are depopulated. Persons of ordinary skill in the art will realize that many other CCRU circuit topologies with different numbers of level 2 multiplexers, level 2 internal interconnects, level 3 multiplexers, and connect points are possible. Such skilled persons will appreciate that many different population patterns of connect points are possible in any specific topology as a matter of design choice.

While embodiments and applications of this invention have been shown and described, it would be apparent to those of ordinary skill in the art that many more modifications than mentioned above are possible without departing from the inventive concepts herein. The invention, therefore, is not to be restricted except in the spirit of the appended claims.

What is claimed is:

1. A logic cluster for a field programmable gate array integrated circuit device, comprising:
   (a) a plurality of functional blocks each having a plurality of inputs and at least one output;
   (b) a first level of multiplexers, each multiplexer having:
      (i) a plurality of data channels, and
      (ii) an output coupled to exactly one of the functional block inputs;
   (c) a second level of multiplexers, each multiplexer having:
      (i) a plurality of data channels, and
      (ii) an output;
   (d) a third level of multiplexers, each multiplexer having:
      (i) a plurality of data channels, and
      (ii) an output;
   (e) a plurality of external interconnects, each interconnect being coupled to at least one third level multiplexer data channel;
   (f) a first plurality of internal interconnects, each interconnect being coupled between one second level multiplexer output and at least one first level multiplexer data channel;
   (g) a second plurality of internal interconnects, each interconnect being coupled between one third level multiplexer output and at least one second level multiplexer data channel;
   (h) a first plurality of feedback interconnects, each interconnect being coupled between one functional block output and at least one second level multiplexer data channel; and
   (i) a second plurality of feedback interconnects, each interconnect being coupled between one functional block output and at least one third level multiplexer data channel associated with a fastest one of the first level of multiplexers.

2. The logic cluster of claim 1, wherein:
   (a) each functional block has a combinational output and a sequential output;
   (b) each interconnect of the first plurality of feedback interconnects is coupled to a functional block combinational output; and
   (c) each interconnect of the second plurality of feedback interconnects is coupled to a functional block sequential output.

3. The logic cluster of claim 2, further comprising a third plurality of feedback interconnects, each interconnect being coupled between a functional block combinational output and at least one first level multiplexer data channel.

4. The logic cluster of claim 3, wherein at least one of the external interconnects is further coupled to at least one second multiplexer data channel.

5. The logic cluster of claim 2, wherein at least one of the external interconnects is further coupled to at least one second multiplexer data channel.

6. A logic cluster for a field programmable gate array integrated circuit device having a plurality of speed classes, each speed class comprising a group of select signal paths, having a propagation delay substantially different from the propagation delay of the select signal paths of every other speed class, the logic cluster comprising:
   (a) a plurality of functional blocks, each with a plurality of logic inputs, a plurality of sequential control inputs, a combinational output, and a sequential output, wherein:
      (i) the propagation delay from each logic input to the combinational output is substantially different from the propagation delay from every other input to the combinational output,
      (ii) each logic input is traversed by the select signal paths of exactly one speed class, and
      (iii) each logic input is traversed by the select signal paths of a different speed class;
   (b) a first level of multiplexers, each multiplexer having a plurality of data channels and an output, wherein:
      (i) each of the multiplexers in the first plurality of multiplexers having its output coupled to exactly one of the logic inputs in the plurality of functional blocks, and
      (ii) the number of multiplexers in the first plurality of multiplexers is equal to the number of logic inputs in the plurality of functional blocks;
   (c) a second level of multiplexers, each multiplexer having a plurality of data channels and an output;
   (d) a third level of multiplexers, each multiplexer having a plurality of data channels and an output;
   (e) a plurality of external interconnects, each interconnect being coupled to at least one third level multiplexer data channel;
   (f) a first level of internal interconnects, each interconnect being coupled between one second level multiplexer output and at least one first level multiplexer data channel; and
   (g) a second level of internal interconnects, each interconnect being coupled between one third level multiplexer output and at least one second level multiplexer data channel, wherein each select signal path
      (i) originates at the input of second level multiplexer data channel, and
      (ii) terminates at a functional block combinational output.

7. The logic cluster of claim 6, wherein:
   (a) each of the first level multiplexers is traversed by a subset of the select signal paths of exactly one speed class;
   (b) each of the first level internal interconnects is traversed by a subset of the select signal paths of exactly one speed class;
   (c) each of the second level multiplexers is traversed by a subset of the select signal paths of exactly one speed class;
   (d) the propagation delays of the select signal paths in each speed class are substantially different from the propagation delays of the select signal paths in each of the other speed classes; and
   (e) each functional block logic input having the smallest propagation delay to the combinational output of the same functional block is traversed by a subset of the select signal paths of the speed class with the smallest propagation delay.

8. The logic cluster of claim 7, wherein one of the external interconnects is further coupled to a second level multiplexer data channel traversed by a subset of the select signal paths of the speed class with the smallest propagation delay.

9. The logic cluster of claim 6, further comprising:
   (a) a first plurality of feedback interconnects each coupling a functional block combinational output to at least one second level multiplexer data channel; and
   (b) a second plurality of feedback interconnects each coupling a functional block sequential output to at least one third level multiplexer data channel.

10. The logic cluster of claim 9, wherein:
   (a) each of the first level multiplexers is traversed by a subset of the select signal paths of exactly one speed class;
   (b) each of the first level internal interconnects is traversed by a subset of the select signal paths of exactly one speed class;
   (c) each of the second level multiplexers is traversed by a subset of the select signal paths of exactly one speed class;
   (d) the propagation delays of the select signal paths in each speed class are substantially different from the propagation delays of the select signal paths in each of the other speed classes; and
   (e) each functional block logic input having the smallest propagation delay to the combinational output of the same functional block is traversed by a subset of the select signal paths of the speed class with the smallest propagation delay.

11. The logic cluster of claim 10, wherein one of the external interconnects is further coupled to a second level multiplexer data channel traversed by a subset of the select signal paths of the speed class with the smallest propagation delay.

12. The logic cluster of claim 6, further comprising a third plurality of feedback interconnects each feedback interconnect coupling a functional block combinational output to a first level multiplexer data channel.

13. The logic cluster of claim 12, wherein:
   (a) each of the first level multiplexers is traversed by a subset of the select signal paths of exactly one speed class;
   (b) each of the first level internal interconnects is traversed by a subset of the select signal paths of exactly one speed class;
   (c) each of the second level multiplexers is traversed by a subset of the select signal paths of exactly one speed class;
   (d) the propagation delays of the select signal paths in each speed class are substantially different from the propagation delays of the select signal paths in each of the other speed classes; and
   (e) each functional block logic input having the smallest propagation delay to the combinational output of the same functional block is traversed by a subset of the select signal paths of the speed class with the smallest propagation delay.

14. The logic cluster of claim 13, wherein one of the external interconnects is further coupled to a second level multiplexer data channel traversed by a subset of the select signal paths of the speed class with the smallest propagation delay.

\* \* \* \* \*